United States Patent
Shinohara et al.

(10) Patent No.: US 10,074,556 B2
(45) Date of Patent: Sep. 11, 2018

(54) METHOD OF MANUFACTURING SEMICONDUCTOR DEVICE

(71) Applicant: Renesas Electronics Corporation, Tokyo (JP)

(72) Inventors: Masaaki Shinohara, Tokyo (JP); Shigeo Tokumitsu, Ibaraki (JP)

(73) Assignee: Renesas Electronics Corporation, Koutou-ku, Tokyo (JP)

( * ) Notice: Subject to any disclaimer, the term of this patent is extended or adjusted under 35 U.S.C. 154(b) by 0 days.

(21) Appl. No.: 15/180,484

(22) Filed: Jun. 13, 2016

(65) Prior Publication Data
US 2017/0047338 A1    Feb. 16, 2017

(30) Foreign Application Priority Data
Aug. 10, 2015    (JP) .................................. 2015-158245

(51) Int. Cl.
*H01L 21/764*    (2006.01)
*H01L 21/762*    (2006.01)
(Continued)

(52) U.S. Cl.
CPC ........ *H01L 21/764* (2013.01); *H01L 21/3083* (2013.01); *H01L 21/31144* (2013.01); *H01L 21/76224* (2013.01); *H01L 21/823878* (2013.01); *H01L 27/0922* (2013.01); *H01L 27/11526* (2013.01); *H01L 29/66659* (2013.01); *H01L 29/66689* (2013.01); *H01L 29/7816* (2013.01); *H01L 29/7835* (2013.01); *H01L 21/823481* (2013.01); *H01L 21/823814* (2013.01); *H01L 27/11546* (2013.01); *H01L 29/0653* (2013.01); *H01L 29/0878* (2013.01); (Continued)

(58) Field of Classification Search
None
See application file for complete search history.

(56) References Cited

U.S. PATENT DOCUMENTS 8,357,989 B2 * 1/2013 Onishi .................. H01L 21/764
                                                    257/397
8,569,839 B2    10/2013 Morii et al.
(Continued)

FOREIGN PATENT DOCUMENTS

JP    2011-151121 A    8/2011

*Primary Examiner* — Abul Kalam
(74) *Attorney, Agent, or Firm* — Sughrue Mion, PLLC

(57) ABSTRACT

A method of manufacturing a semiconductor device includes the steps of forming a plurality of gate electrodes, forming a first insulating film over the plurality of gate electrodes such that the first insulating film is embedded in a space between the plurality of gate electrodes, forming a second insulating film over the first insulating film, forming a third insulating film over the second insulating film, forming a photosensitive pattern over the third insulating film, performing etching using the photosensitive pattern as a mask to form a trench extending through the first to third insulating films and reaching a semiconductor substrate, removing the photosensitive pattern, performing etching using the exposed third insulating film as a mask to extend the trench in the semiconductor substrate, removing the third and second insulating films, and forming a fourth insulating film in the trench and over the first insulating film.

5 Claims, 32 Drawing Sheets

(51) Int. Cl.

| | | |
|---|---|---|
| *H01L 27/11526* | (2017.01) | |
| *H01L 21/311* | (2006.01) | |
| *H01L 21/308* | (2006.01) | |
| *H01L 29/78* | (2006.01) | |
| *H01L 27/092* | (2006.01) | |
| *H01L 29/66* | (2006.01) | |
| H01L 27/11546 | (2017.01) | |
| H01L 21/8234 | (2006.01) | |
| H01L 21/8238 | (2006.01) | |
| H01L 29/06 | (2006.01) | |
| H01L 29/10 | (2006.01) | |
| H01L 29/08 | (2006.01) | |

(52) U.S. Cl.
CPC ...... *H01L 29/1045* (2013.01); *H01L 29/1083* (2013.01); *H01L 29/7833* (2013.01)

(56) References Cited

U.S. PATENT DOCUMENTS

| | | | |
|---|---|---|---|
| 8,692,352 B2* | 4/2014 | Onishi | H01L 21/764 |
| | | | 257/397 |
| 9,536,776 B2* | 1/2017 | Murata | H01L 21/02216 |
| 2010/0181640 A1* | 7/2010 | Shiromoto | H01L 21/76264 |
| | | | 257/506 |
| 2011/0062547 A1* | 3/2011 | Onishi | H01L 21/764 |
| | | | 257/510 |
| 2013/0134549 A1* | 5/2013 | Onishi | H01L 21/764 |
| | | | 257/522 |
| 2015/0206787 A1* | 7/2015 | Murata | H01L 21/02216 |
| | | | 438/422 |

* cited by examiner

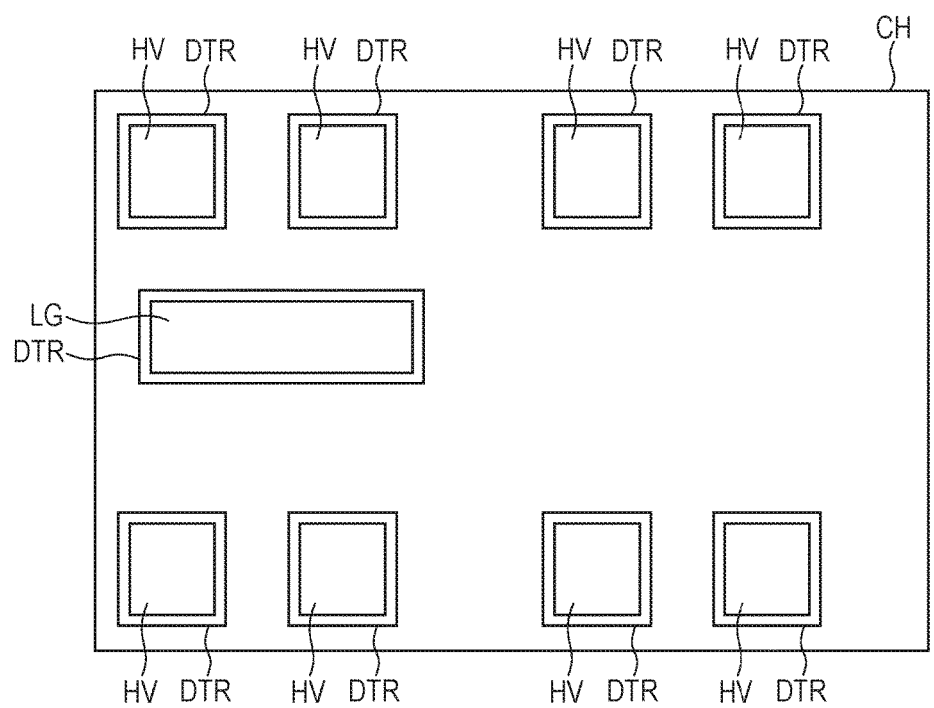
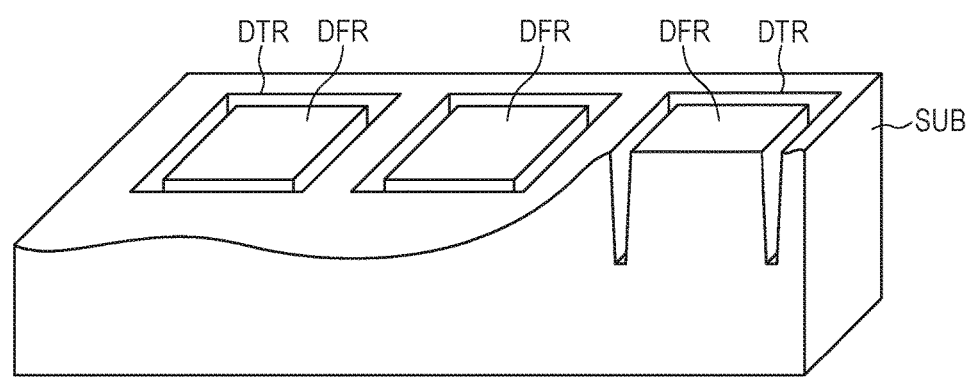

METHOD OF MANUFACTURING SEMICONDUCTOR DEVICE

CROSS-REFERENCE TO RELATED APPLICATIONS

The disclosure of Japanese Patent Application No. 2015-158245 filed on Aug. 10, 2015 including the specification, drawings and abstract is incorporated herein by reference in its entirety.

BACKGROUND

The present invention relates to a method of manufacturing a semiconductor device, and particularly to a method of manufacturing a semiconductor device having a trench.

A Deep Trench Isolation (DTI) structure in which an insulating film is embedded in a trench with a high aspect ratio is disclosed in, e.g., Japanese Unexamined Patent Publication No. 2011-151121.

In accordance with the technique described in this publication, a high-breakdown-voltage MOS transistor having a source region and a drain region in a surface of a semiconductor substrate is completed. In the surface of the semiconductor substrate, a trench is formed to surround the transistor in plan view. Over the transistor and in the trench, an insulating film is formed so as to cover the transistor from above and form a hollow in the trench.

After the DTI structure is formed as described above, an electronic element such as a MOSFET (Metal Oxide Semiconductor Field Effect Transistor) is formed in the semiconductor substrate.

RELATED ART DOCUMENT

Patent Document

[Patent Document 1]
Japanese Unexamined Patent Publication No. 2011-151121

SUMMARY

When the trench is formed, an oxide film is formed over the gate of the transistor and the trench is formed by anisotropic etching using the oxide film as a mask. Then, an insulating film is formed so as to form the hollow in the trench.

During the anisotropic etching, the oxide film corresponding to a predetermined film thickness is also removed by etching. The film thickness of the oxide film after the anisotropic etching varies in a wafer plane. The variations in the film thickness of the insulating film causes layer-to-layer variations when contacts are formed to also cause variations in transistor characteristic.

Other problems and novel features of the present invention will become apparent from a statement in the present specification and the accompanying drawings.

According to an embodiment, a method of manufacturing a semiconductor device includes the steps of forming a plurality of gate electrodes over a main surface of a semiconductor substrate and forming a first insulating film over the plurality of gate electrodes so as to be embedded in a space between the plurality of gate electrodes. The method further includes the steps of forming a second insulating film made of a material different from that of the first insulating film over the first insulating film and forming a third insulating film made of a material different from that of the second insulating film over the second insulating film. The method further includes the steps of forming a photosensitive pattern over the third insulating film and performing etching using the photosensitive pattern as a mask to form a trench extending through the first to third insulating films and reaching the semiconductor substrate. The method further includes the steps of removing the photosensitive pattern so as to expose the third insulating film, performing etching using the exposed third insulating film as a mask to extend the trench in the semiconductor substrate, removing the third and second insulating films, and forming a fourth insulating film in the trench and over the first insulating film so as to form a hollow space in the trench.

According to the embodiment, after the etching is performed using the third insulating film as the mask, the third and second insulating films are removed. Accordingly, it is possible to remove the varying portions of the insulating film in a wafer plane. This can suppress variations in the film thickness of the insulating film and variations in transistor characteristic.

BRIEF DESCRIPTION OF THE DRAWINGS

FIG. 1 is a schematic plan view illustrating a configuration of a semiconductor device in a chip state based on Embodiment 1;

FIG. 2 is a partially broken perspective view showing the element formation region shown in FIG. 1 which is surrounded by a trench in plan view;

DETAILED DESCRIPTION

Figure 3:
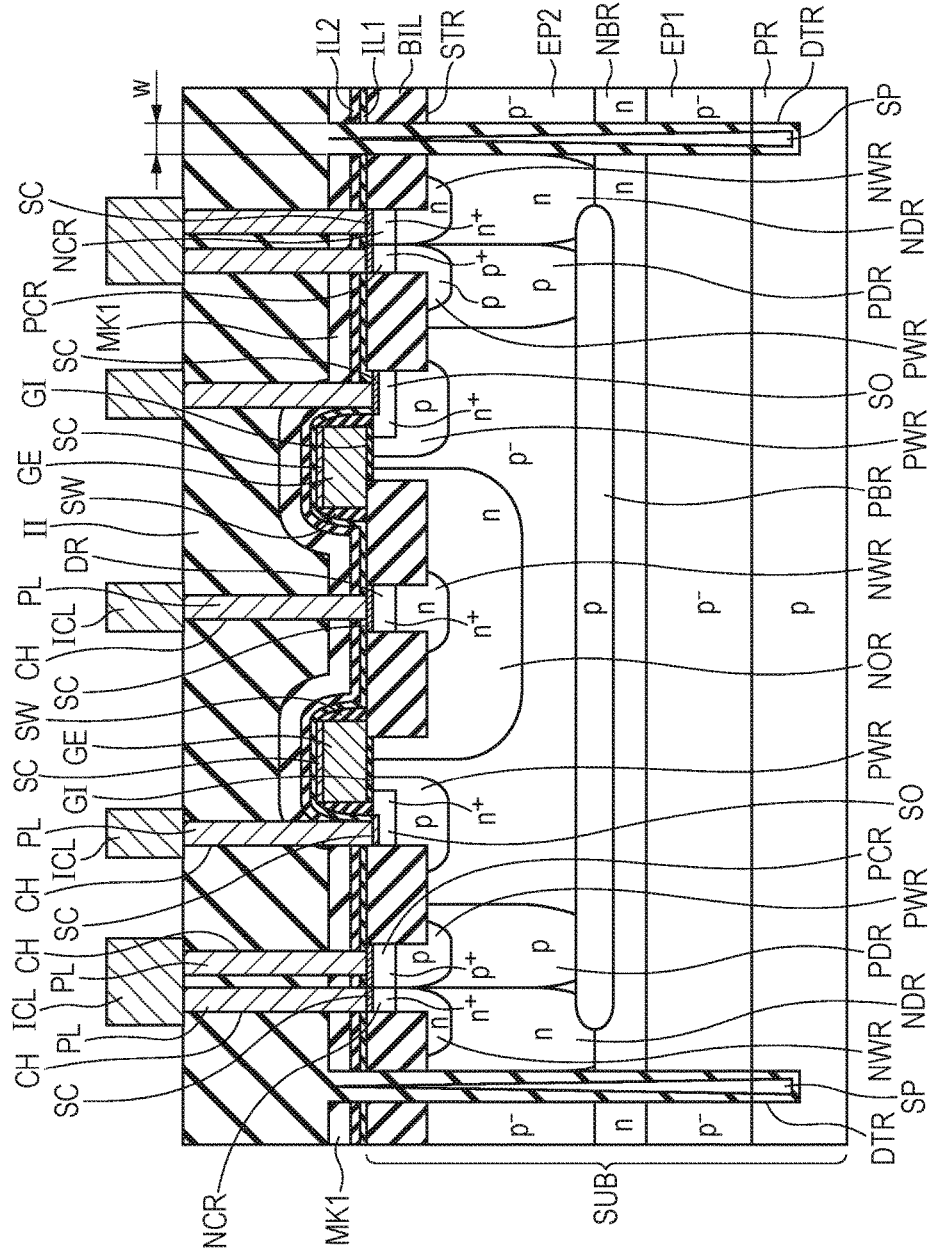
FIG. 3 is a schematic cross-sectional view showing the configuration of the semiconductor device in Embodiment 1, which is the element surrounded by the trench in FIG. 2.

Referring to the drawings, embodiments will be described in detail. Note that the same or equivalent parts in the drawings are designated by the same reference numerals and a description thereof is not repeated.

Embodiment 1

FIG. 1 is a schematic plan view illustrating a configuration of a semiconductor device in a chip state based on Embodiment 1.

Referring to FIG. 1, a semiconductor chip CP of a BiC-DMOS (Bipolar Complementary Metal Oxide Semiconductor Double-diffused Metal Oxide Semiconductor) has a logic portion LG in which, e.g., low-breakdown-voltage CMOS (Complementary MOS) transistors are integrated and output driver portions HV using high-breakdown-voltage elements. In the logic portion LG described above, the region where the low-breakdown-voltage CMOS transistors are formed is surrounded by a trench DTR having a DTI structure in plan view. On the other hand, in the output driver portions HV, the respective regions where the individual elements are formed are surrounded by the trenches DTR each having the DTI structure in plan view.

FIG. 2 is a partially broken perspective view showing each of the element formation regions shown in FIG. 1 which is surrounded by the trench in plan view.

Referring to FIG. 2, in, e.g., the output driver units HV, the respective element formation regions DFR for the individual high-breakdown-voltage elements are two-dimensionally surrounded by the trenches DTR each having the DTI structure. The trenches DTR are formed in a surface of a semiconductor substrate SUB.

Next, a description will be given of the case where a high-breakdown-voltage lateral MOS transistor is used as each of the high-breakdown-voltage elements mentioned above.

FIG. 3 is a schematic cross-sectional view showing a configuration of the semiconductor device in Embodiment 1, which is each of the elements surrounded by the trenches in FIG. 2.

Referring to FIG. 3, the semiconductor substrate SUB is made of, e.g., silicon and selectively has trenches STR in the main surface thereof. In the trenches STR, embedded insulating films BIL are formed. The trenches STR and the embedded insulating film BIL form STI (Shallow Trench Isolation) structures.

Over a p-type region PR of the semiconductor substrate SUB, a p$^-$ epitaxial region EP1 and an n-type embedded region NBR are formed. Over the n-type embedded region NBR, a p-type embedded region PBR is selectively formed. Over the n-type embedded region NBR and the p-type embedded region PBR, a p$^-$ epitaxial region EP2 is formed.

In the p$^-$ epitaxial region EP2 mentioned above and in the surface of the semiconductor substrate SUB, a high-breakdown-voltage lateral MOS transistor is formed. The highbreakdown-voltage lateral MOS transistor has an n-type offset region NOR, n-type well regions NWR, p-type well regions PWR, an n$^+$ drain region DR, n$^+$ source regions SO, gate insulating films 31, and gate electrode layers GE as main components.

The n-type offset region NOR is formed in the surface of the semiconductor substrate SUB so as to form a pn junction with the p$^-$ epitaxial region EP2. The n-type well region NWR is formed so as to come in contact with the n-type offset region NOR. The n$^+$ drain region DR is formed in the surface of the semiconductor substrate SUB so as to come in contact with the n-type well region NWR.

The p-type well regions PWR are formed in the p$^-$ epitaxial region EP2 and in the surface of the semiconductor substrate SUB. The n$^+$ source regions SO are formed in the surface of the semiconductor substrate SUB so as to form pn junctions with the p-type well regions PWR. Between the n$^+$ source regions SO and the n-type offset region NOR, the p-type well regions PWR and the p$^-$ epitaxial region EP2 are interposed along the surface of the semiconductor substrate SUB.

The gate electrode layers GE are formed over the semiconductor substrate SUB so as to face the p-type well regions PWR and the p$^-$ epitaxial region EP2 which are interposed between the n$^+$ source regions SO and the n-type offset region NOR via the gate insulating films GI. One end portion of each of the gate electrode layers GE is located over the STI structure formed in the n-type offset region NOR. Sidewall insulating layers SW are formed so as to cover the side walls of the gate electrodes GE.

In the embodiment, silicide layers SC are preferably formed over the respective surfaces of the n$^+$ source regions SO, the n$^+$ drain region DR, and the gate electrode layers GE. However, the silicide layers SC may also be omitted.

Also, in the p$^-$ epitaxial region EP2, p-type sinker regions PDR are formed so as to come in contact with the p-type embedded region PBR. In the p-type sinker regions PDR, the p-type well regions PWR and p$^+$ contact regions PCR are formed closer to the surface of the semiconductor substrate SUB. To electrically isolate the p-type well regions PCR and the n$^+$ source regions SO from each other, in the surface of the semiconductor substrate SUB located between the p$^+$-type contact regions PCR and the n$^+$ source regions SO, the STI structures are formed.

Also, in the p$^-$ epitaxial region EP2, n-type sinker regions NDR are formed so as to come in contact with the n-type embedded region NBR. In the n-type sinker regions NDR, the n-type well regions NWR and n$^+$ contact regions NCR are formed closer to the surface of the semiconductor substrate SUB. Preferably, the silicide layers SC are formed in the respective surfaces of the n$^+$-type contact region NCR and the p$^+$-type contact regions PCR. However, the silicide layers SC may also be omitted.

Insulating films IL1 and IL2, a mask material MK, and an insulating film II are stacked successively so as to cover the high-breakdown-voltage lateral MOS transistor. The insulating film IL1 is, e.g., a silicon dioxide film and the insulating film IL2 is, e.g., a silicon nitride film. The mask material MK is, e.g., a silicon dioxide film. The insulating films IL1 and IL2 and the mask material MK are formed over the gate electrode layers GE so as to be embedded in the spaces between the gate electrodes of the plurality of gate electrode layers GE. The insulating film II is formed so as to cover the mask material MK.

The insulating film II is made of a stacked structure including, e.g., BP-TEOS (Boro-Phospho-Tetra-Ethyl-Ortho-Silicate) and a silicon dioxide film formed thereover by a plasma CVD (Chemical Vapor Deposition) method. Note that the BP-TEOS (BPSG standing for Boro-Phosphate Silicate Glass) included in the insulating film II may appropriately be an insulating film containing an impurity which is at least either one of a group III element and a group V element, such as P-TEOS (PSG standing for Phosphorus Silicon Glass) or B-TEOS (BSG standing for Boro Silicate Glass).

In the insulating films IL1 and IL2, the mask material MK, and the insulating film II, contact holes CH are formed and, in the contact holes CH, plug conductive layers PL are formed. Over the insulating film II, a wiring layer ICL is formed. The wiring layer ICL is electrically coupled to the conductive portions (such as, e.g., the source regions SO, the n$^+$ drain regions DR, the contact regions NCR and PCR, and the gate electrode layers GE) of the high-breakdown-voltage lateral MOS transistor via the plug conductive layers PL in the contact holes CH.

The DTI structure is formed so as to surround the region where the high-breakdown-voltage lateral MOS transistor described above is formed in plan view. The DTI structure has the trench (first trench) DTR extending from the surface of the semiconductor substrate SUB into the semiconductor substrate SUB and the insulating film II formed in the trench DTR. The trench DTR is formed so as to extend from the surface of the semiconductor substrate SUB through the p epitaxial region EP2, the n-type embedded region NBR, and the p epitaxial region EP1 and reach the p-type region PR.

The insulating film II formed in the trench DTR mentioned above is an interlayer insulating film formed over the high-breakdown-voltage lateral MOS transistor. The trench DTR is not completely filled with the insulating film II and a hollow (void) SP is formed in the trench DTR.

Preferably, the hollow SP is formed at least in the vicinity of the junction portion between the n-type embedded region NBR and the p epitaxial region EP1. The hollow SP may also have a height substantially equal to the depth of the trench. Preferably, the aspect ratio (Depth/Width W) of the trench DTR is not less than 1. Preferably, the width W of the trench DTR is not less than 0.3 μm on the basis of a breakdown voltage of 80 V.

The trench DTR may also be formed in the portion where the STI structure is formed. In this case, the trench DTR is formed deeper than each of the trenches STR in the region where the trench (second trench) STR of the STI structure is formed.

Next, using FIGS. 4 to 13, a description will be given of a method of manufacturing a semiconductor device having not only the high-breakdown-voltage lateral MOS transistor, but also a p-channel MOS transistor (referred to as a pMOS transistor), a CMOS transistor, and a nonvolatile semiconductor memory as the semiconductor device based on Embodiment 1.

Figure 4:
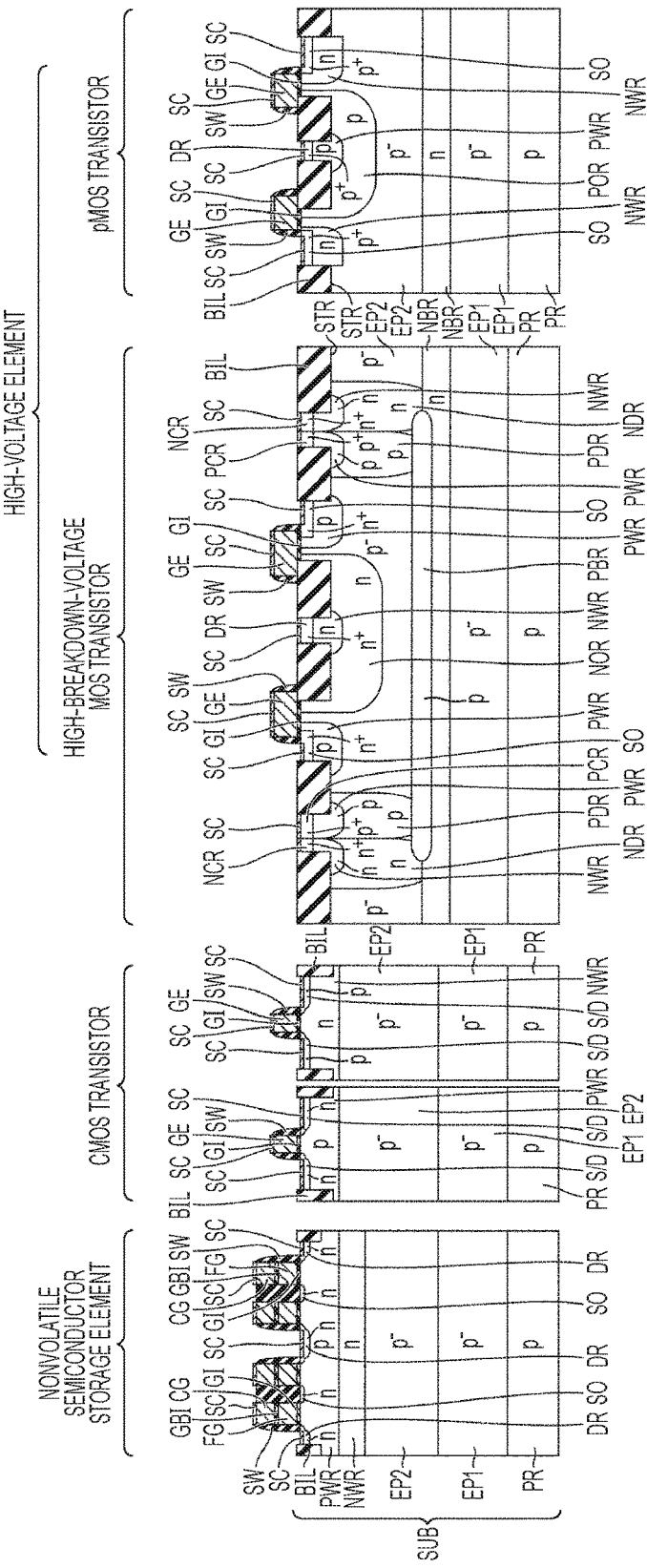
FIG. 4 is a schematic cross-sectional view showing a first step of a method of manufacturing the semiconductor device based on Embodiment 1.

FIG. 4 is a schematic cross-sectional view showing a first step of the method of manufacturing the semiconductor device based on Embodiment 1.

Referring to FIG. 4, first, in the surface of the semiconductor substrate SUB, individual elements (high-breakdown-voltage lateral MOS transistor, pMOS transistor, CMOS transistor, and nonvolatile semiconductor storage element) are completed.

The high-breakdown-voltage lateral MOS transistor is formed so as to have the n-type offset region NOR, the n-type well regions NWR, the p-type well regions PWR, the n$^+$ drain region DR, the n$^+$ source regions SO, the gate insulating films GI, and the gate electrode layers GE.

The pMOS transistor as the high-breakdown-voltage element is formed so as to have a p-type offset region POR, the n-type well regions NWR, the p-type well regions PWR, the p$^+$ drain region DR, the p$^+$ source regions SO, the gate insulating films GI, and the gate electrode layers GE.

The CMOS transistor is formed so as to complete a pMOS transistor and an nMOS transistor. The pMOS transistor is formed so as to have the n-type well region NWR, a pair of p-type source/drain regions S/D each having an LDD (Lightly Doped Drain) structure, the gate insulating film GI, and the gate electrode layers GE. The nMOS transistor is formed so as to have the p-type well region PWR, a pair of n-type source/drain region S/D each having the LDD structure, the gate insulating film GI, and the gate electrode layer GE.

The nonvolatile semiconductor storage element is formed of, e.g., a stacked-gate memory transistor. The stacked-gate memory transistor is formed so as to have the p-type well region PWR, the n-type drain regions DR each having the LDD structure, the n source regions SO, the gate insulating films GI, floating gate electrode layers FG, gate-to-gate insulating films GBI, and control gate electrode layers CG.

In the respective surfaces of impurity regions such as the source regions and the drain regions of the individual elements and the respective surfaces of the gate electrodes of the individual elements, the silicide layers SC may also be formed. In addition, the sidewall insulating layers SW are formed so as to cover the respective side walls of the gate electrode layers GE, FG, and CG of the individual elements.

In the present example, the plurality of gate electrodes of the individual elements are formed over the semiconductor substrate SUB.

Figure 5:
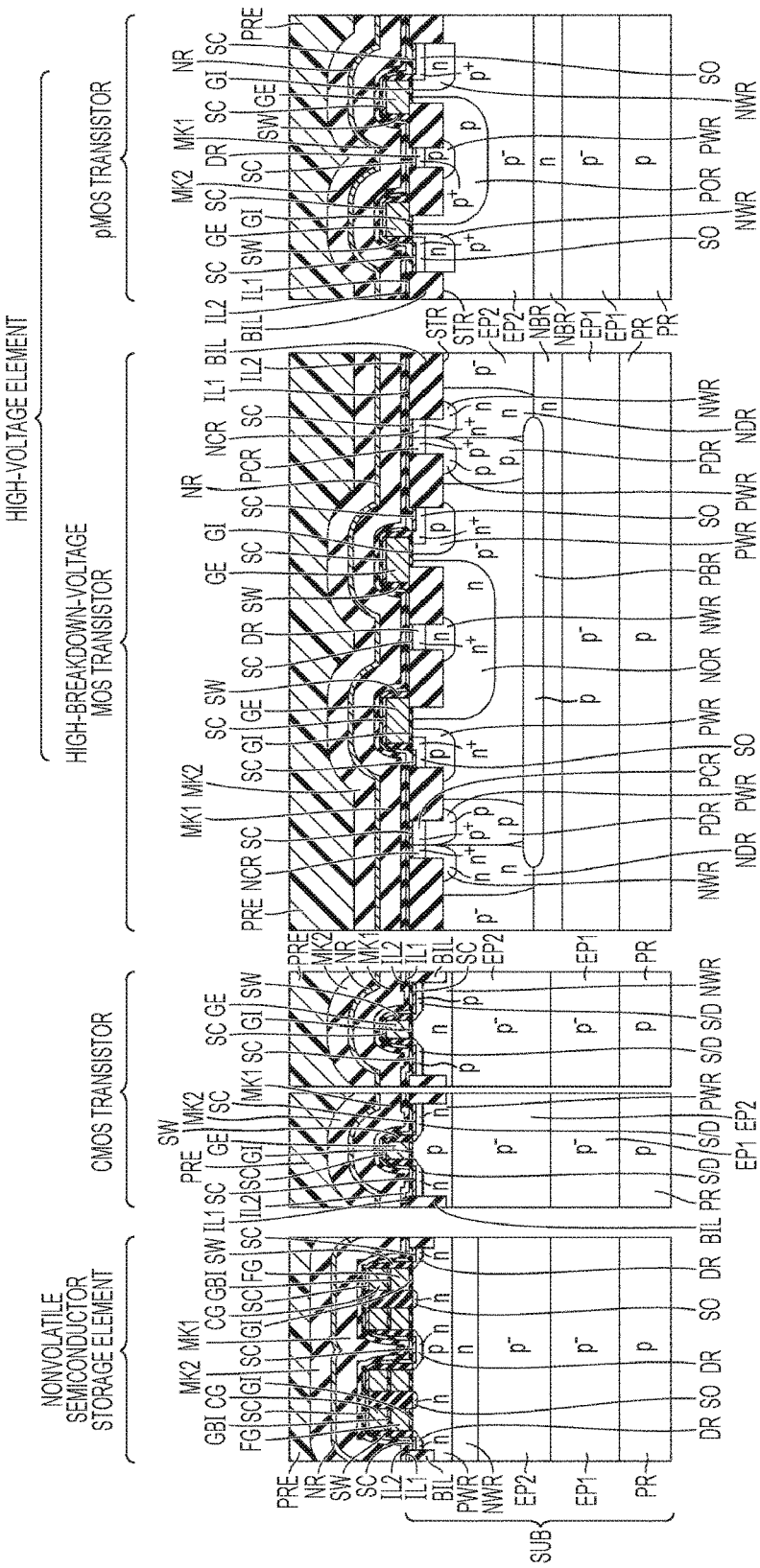
FIG. 5 is a schematic cross-sectional view showing a second step of the method of manufacturing the semiconductor device based on Embodiment 1.

FIG. 5 is a schematic cross-sectional view showing a second step of the method of manufacturing the semiconductor device based on Embodiment 1.

Referring to FIG. 5, the insulating films IL1 and IL2, a mask material MK1 ("first insulating film"), an insulating film NR ("second insulating film"), and a mask material MK2 ("third insulating film") are successively stacked so as to cover the individual elements. The insulating film IL1 is formed of, e.g., a non-doped silicon dioxide film having a thickness of 20 nm. The insulating film IL2 is formed of, e.g., a silicon nitride film having a thickness of 50 nm. The mask material MK1 is formed of, e.g., a non-doped silicon dioxide film having a thickness of 200 nm. The insulating film NR is formed of, e.g., a silicon nitride film having a thickness of 50 nm. The mask material MK2 is formed of, e.g., a non-doped silicon dioxide film having a thickness of 800 nm. The mask materials MK1 and MK2 may be silicon dioxide films made of the same material or can also be silicon dioxide films made of different materials.

To the top surface of the mask material MK2, a resist pattern PRE ("photosensitive pattern") is applied. In the present example, the silicon nitride film is described as an example of an insulating film. However, it is also possible to use a silicon oxynitride film, a carbon-containing silicon nitride film, or a silicon carbonitride film instead of the silicon nitride film.

The mask material MK1 is formed over the plurality of gate electrodes so as to be embedded in the spaces between the plurality of gate electrodes.

This provides a structure in which the insulating film NR is interposed between the mask materials MK1 and MK2.

Note that, after the mask material MK2 ("third insulating film") is stacked, in the present example, the upper surface thereof is polished and removed by, e.g., a CMP (Chemical Mechanical Polishing) method to be planarized.

The planarization allows the shape of the resist pattern PRE to be stabilized. In the present example, a description is given of the case where the upper surface of the mask material MK2 is polished and removed by the CMP method, but the upper surface of the mask material MK2 need not necessarily be removed by polishing.

Figure 6:
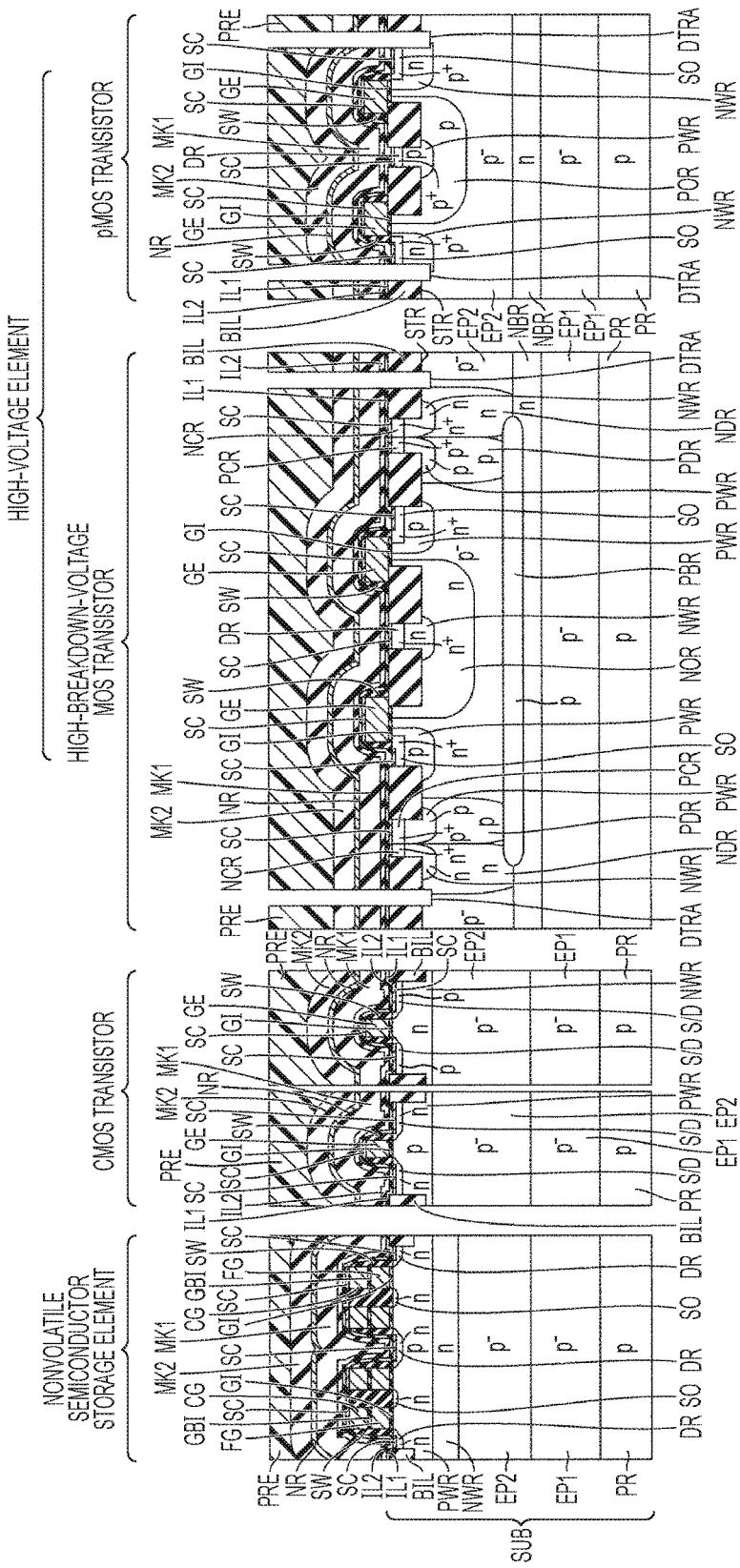
FIG. 6 is a schematic cross-sectional view showing a third step of the method of manufacturing the semiconductor device based on Embodiment 1.

FIG. 6 is a schematic cross-sectional view showing a third step of the method of manufacturing the semiconductor device based on Embodiment 1.

Referring to FIG. 6, the resist pattern PRE is formed by patterning using a typical photomechanical technique. Using the resist pattern PRE formed by the patterning as a mask, the mask material MK2, the insulating film NR, the mask material MK1, the insulating film IL2, the insulating film IL1, and the STI structure are successively anisotropically etched. Thus, trenches DTRA are formed in the surface of the semiconductor substrate SUB.

Figure 7:
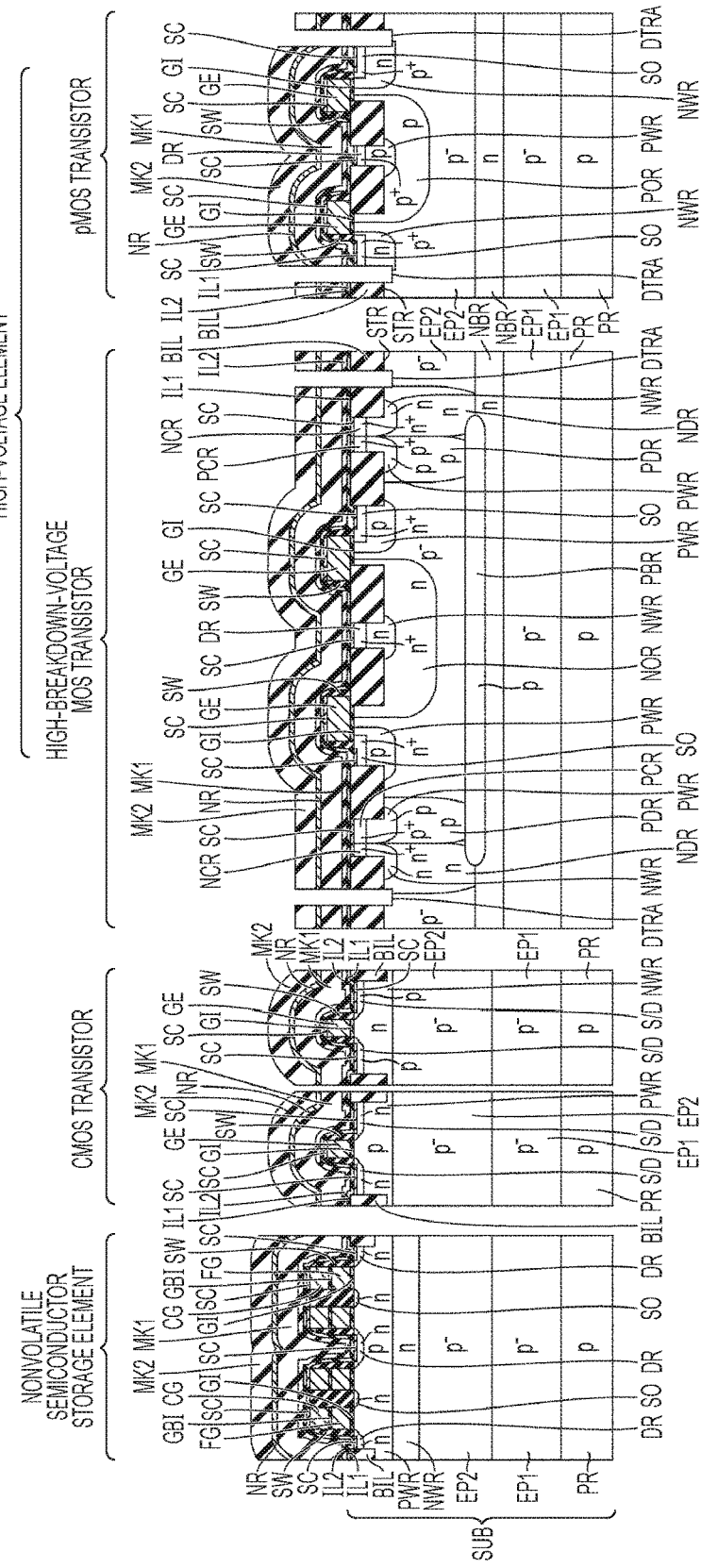
FIG. 7 is a schematic cross-sectional view showing a fourth step of the method of manufacturing the semiconductor device based on Embodiment 1.

FIG. 7 is a schematic cross-sectional view showing a fourth step of the method of manufacturing the semiconductor device based on Embodiment 1.

Referring to FIG. 7, the resist pattern PRE ("photosensitive pattern") is removed by ashing or the like. As a result, the mask material MK2 formed under the resist pattern PRE is exposed.

Figure 8:
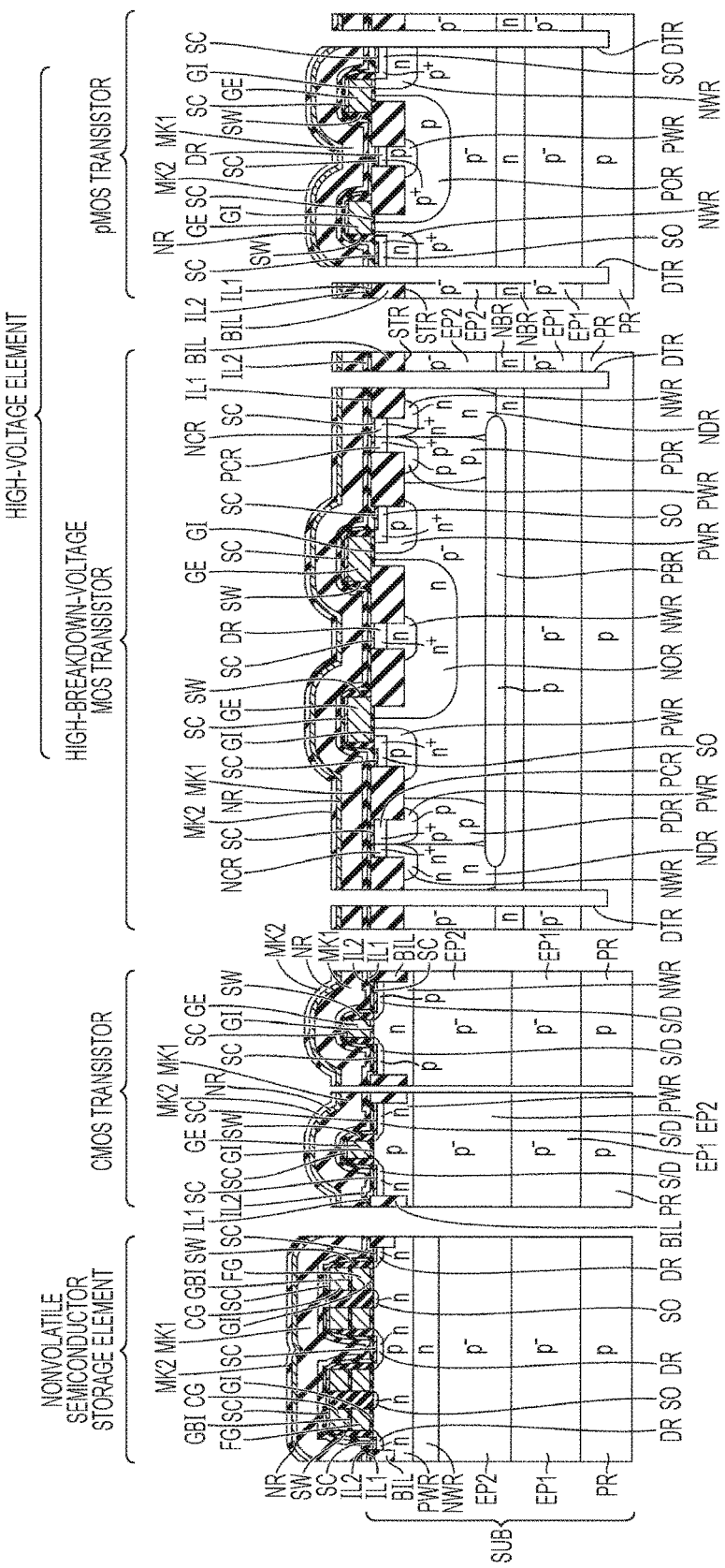
FIG. 8 is a schematic cross-sectional view showing a fifth step of the method of manufacturing the semiconductor device based on Embodiment 1.

FIG. 8 is a schematic cross-sectional view showing a fifth step of the method of manufacturing the semiconductor device based on Embodiment 1.

Referring to FIG. 8, the semiconductor substrate SUB is subjected to anisotropic etching continuously using the mask material MK2 ("third insulating film") as a mask. Thus, the trenches DTR are formed to extend from the surface of the semiconductor substrate SUB through the p epitaxial region EP2, the n-type embedded region NBR, and the p epitaxial region EP1 and reach the p-type region PR.

During the anisotropic etching, the mask material MK2 corresponding to a predetermined film thickness is also removed by etching so that the remaining mask material MK2 has the initial thickness of 300 nm.

Figure 9:
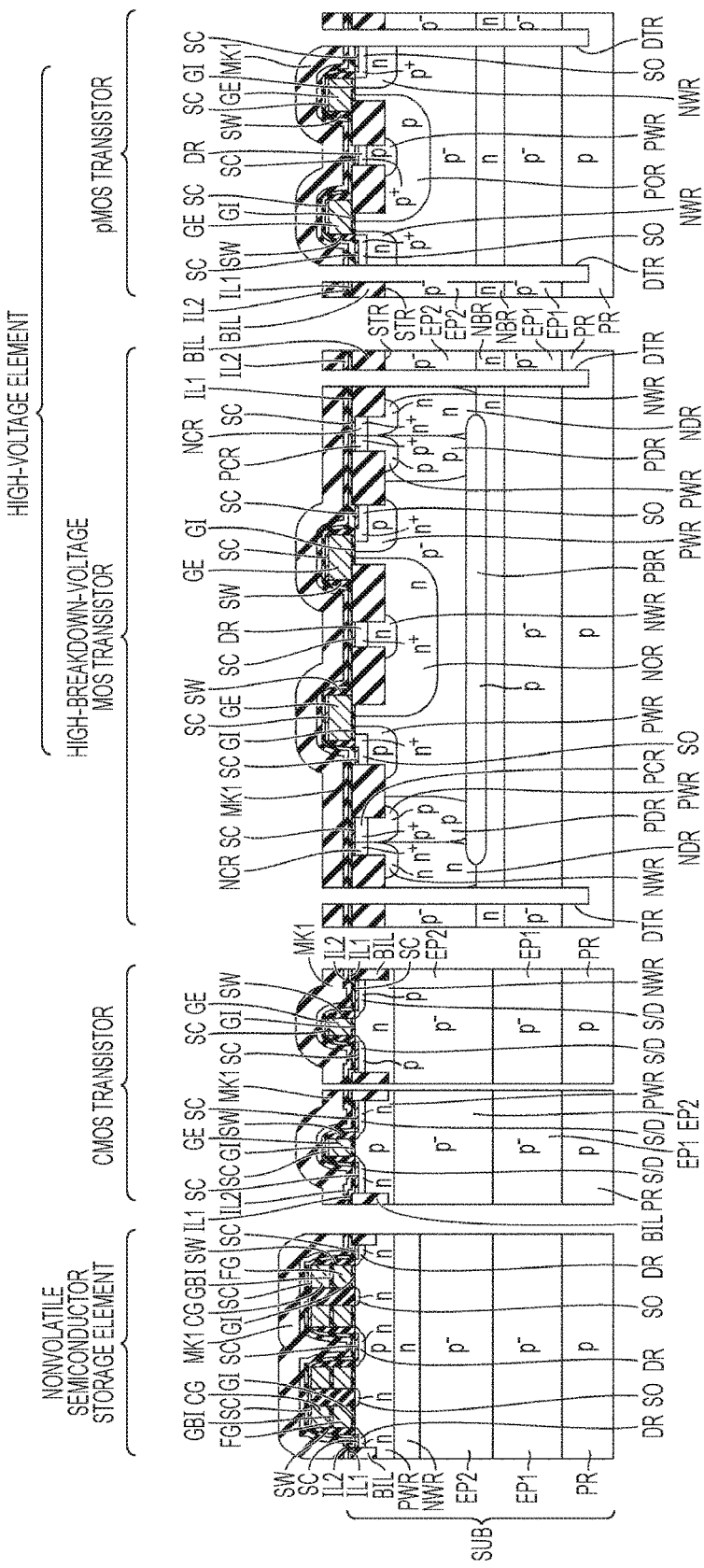
FIG. 9 is a schematic cross-sectional view showing a sixth step of the method of manufacturing the semiconductor device based on Embodiment 1.

FIG. 9 is a schematic cross-sectional view showing a sixth step of the method of manufacturing the semiconductor device based on Embodiment 1.

Referring to FIG. 9, the mask material MK2 is removed by anisotropic etching, while the insulating film NR is removed by isotropic etching or anisotropic etching. Note that the anisotropic etching is performed by dry etching. Note that the isotropic etching is performed by dry or wet etching.

The removal of the mask material MK2 ("third insulating film") is performed using the insulating film NR ("second insulating film") as a stopper. The removal of the insulating film NR is performed using the mask material MK1 as a stopper.

By removing the mask material MK2 and the insulating film NR, it is possible to reset variations in the residual film of a hard mask when the etching is performed using the mask material MK2 as a mask to form the trenches DTR in the fifth step described above.

As a result of removing the mask material MK2 and the insulating film NR each described above, the upper surface of the mask material MK1 is exposed. However, since the mask material MK2 is removed by anisotropic etching, the embedded insulating films BIL of the STI structure exposed at the wall surfaces of the trenches DTR are not reduced in a lateral direction in the drawing (do not recede).

Figure 10:
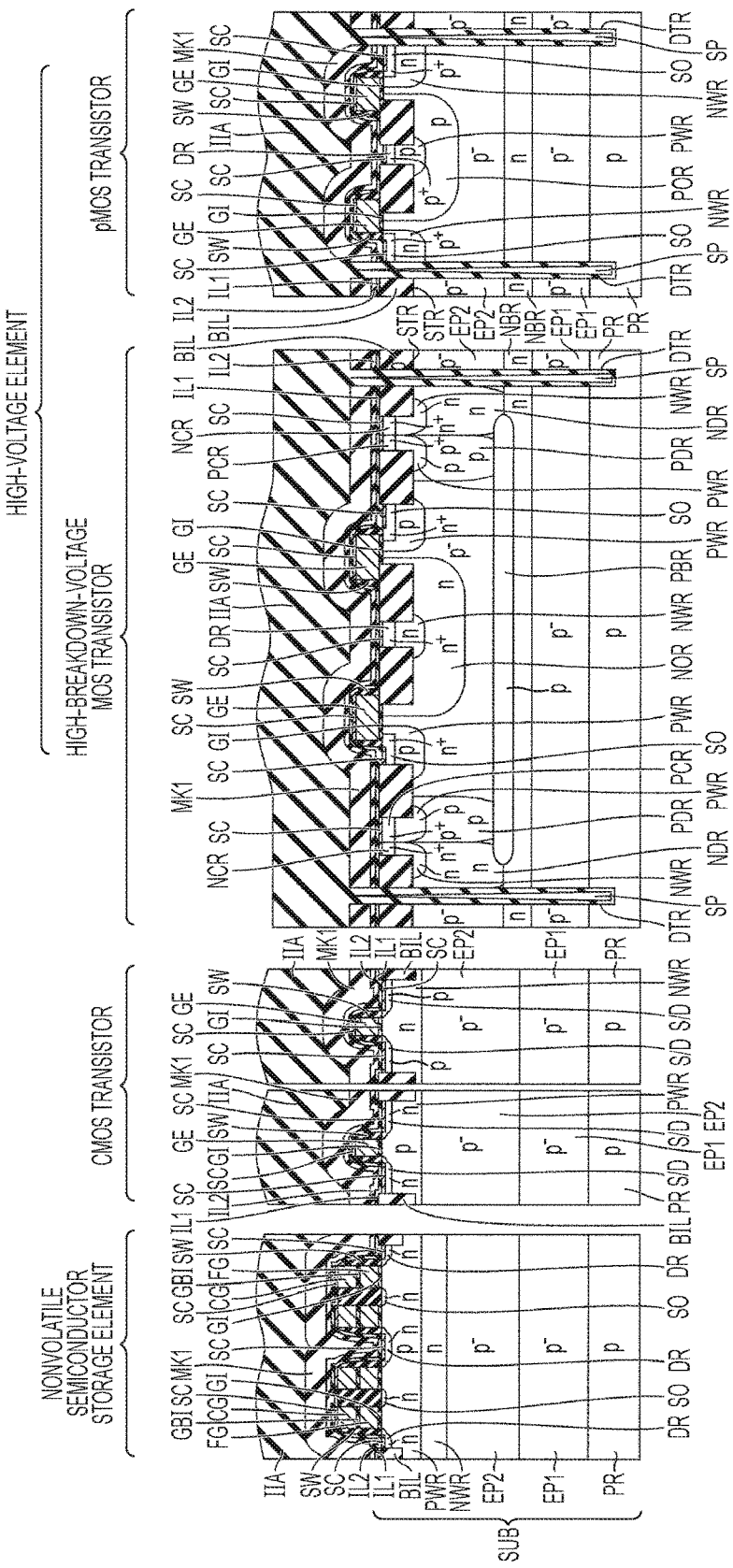
FIG. 10 is a schematic cross-sectional view showing a seventh step of the method of manufacturing the semiconductor device based on Embodiment 1.

FIG. 10 is a schematic cross-sectional view showing a seventh step of the method of manufacturing the semiconductor device based on Embodiment 1.

Referring to FIG. 10, an insulating film IIA ("fourth insulating film") is formed over the individual elements and in the trenches DTR so as to cover the individual elements and form the hollows SP in the trenches DTR. The insulating film IIA is formed of, e.g., BP-TEOS having a thickness of 1450 nm. The upper surface of the insulating film IIA is planarized by, e.g., a CMP (Chemical Mechanical Polishing) method. As a result, the thickness of the insulating film IIA is reduced to, e.g., 750 nm.

Figure 11:
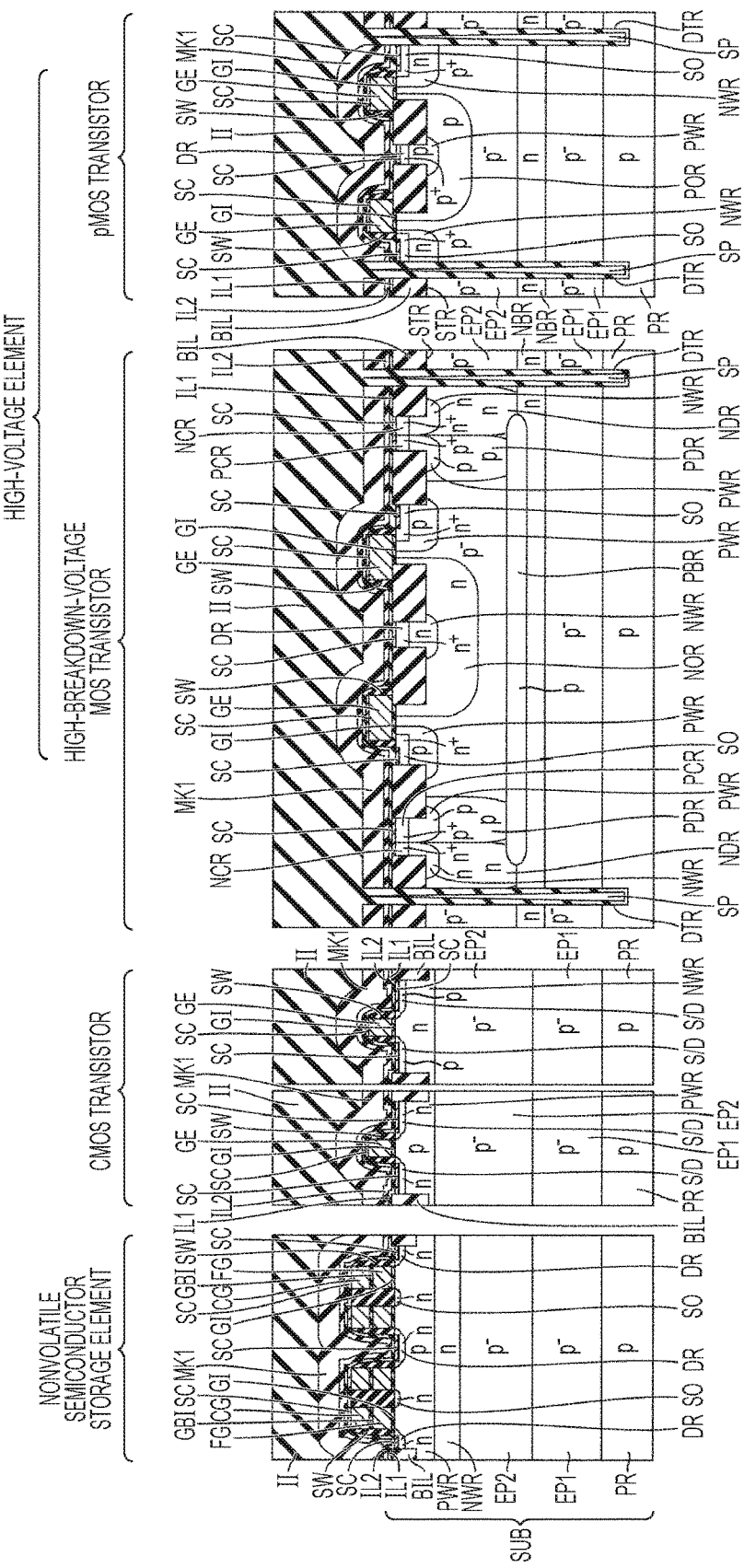
FIG. 11 is a schematic cross-sectional view showing an eighth step of the method of manufacturing the semiconductor device based on Embodiment 1.

FIG. 11 is a schematic cross-sectional view showing an eighth step of the method of manufacturing the semiconductor device based on Embodiment 1.

Referring to FIG. 11, a silicon dioxide film is formed over the insulating film IIA described above by a plasma CVD method. The insulating film IIA and the silicon dioxide film formed by the plasma CVD method form the insulating film II.

Figure 12:
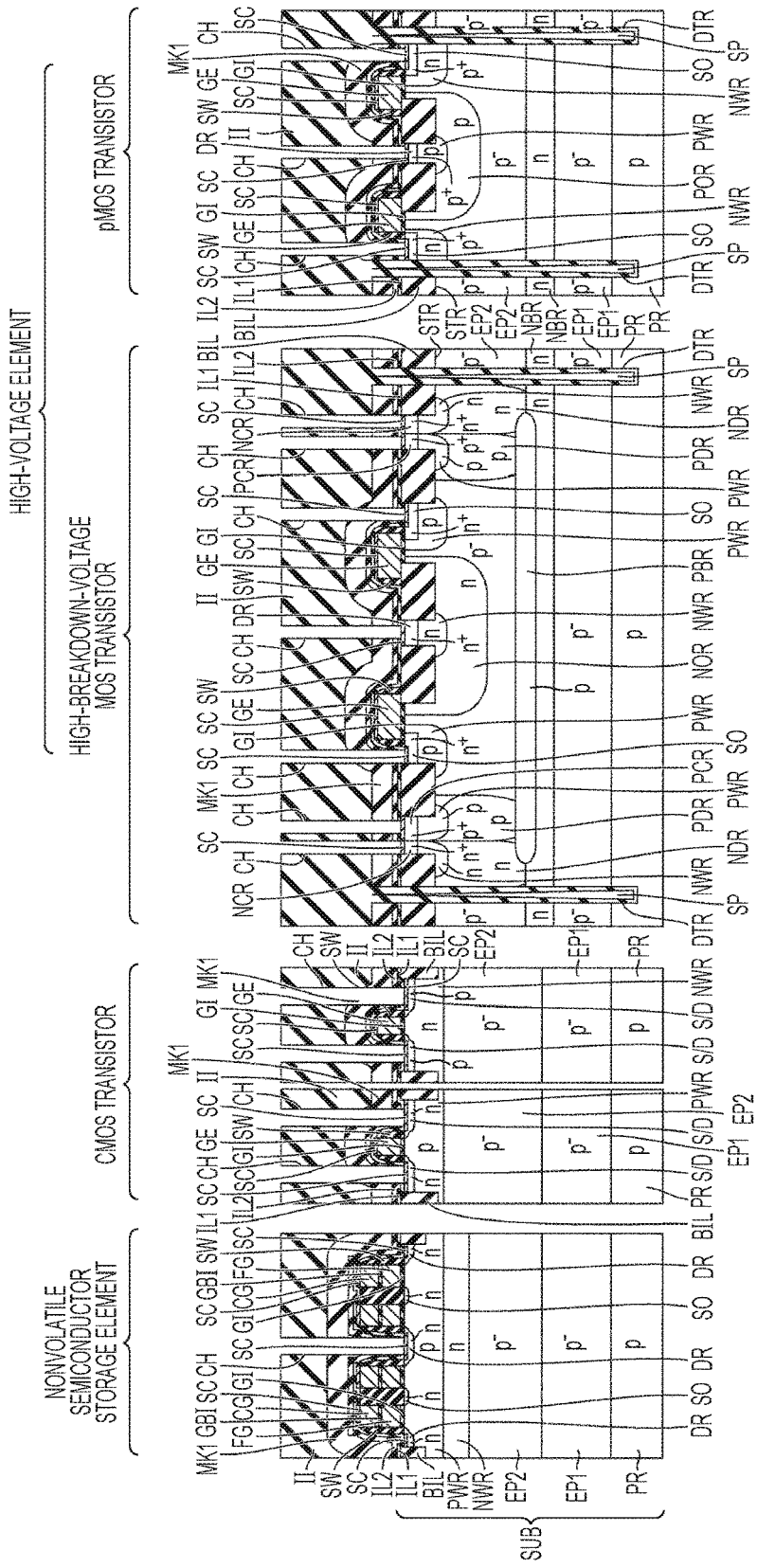
FIG. 12 is a schematic cross-sectional view showing a ninth step of the method of manufacturing the semiconductor device based on Embodiment 1.

FIG. 12 is a schematic cross-sectional view showing a ninth step of the method of manufacturing the semiconductor device based on Embodiment 1.

Referring to FIG. 12, using a typical photomechanical technique and an etching technique, the contact holes CH are formed to extend through the insulating films II, IL2, and IL1 and reach the surface of the semiconductor substrate SUB. From the contact holes CH, e.g., the surfaces of the silicide layers SC formed in the respective surfaces of the source regions, the drain regions, and the like are exposed.

Figure 13:
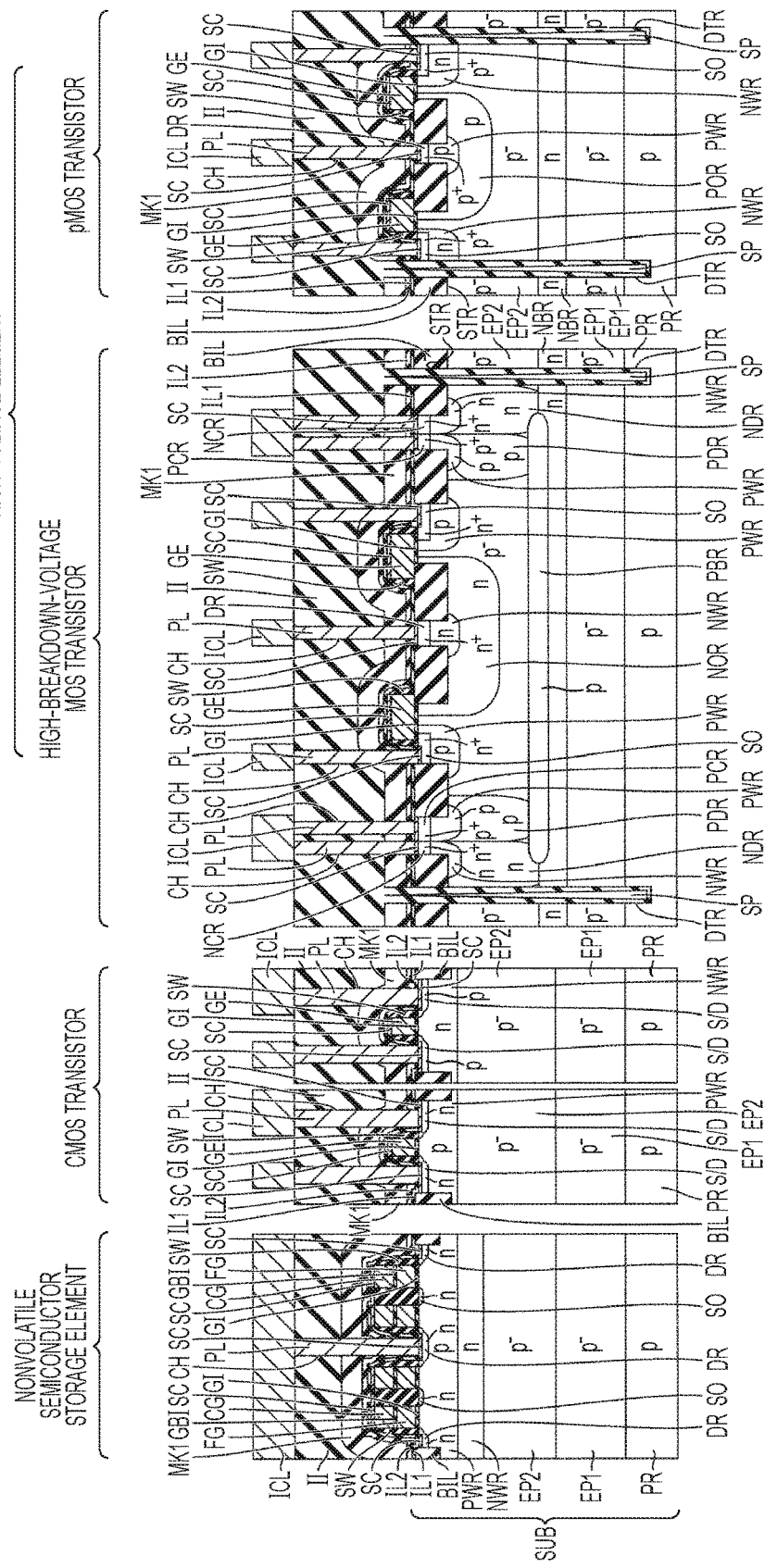
FIG. 13 is a schematic cross-sectional view showing a tenth step of the method of manufacturing the semiconductor device based on Embodiment 1.

FIG. 13 is a schematic cross-sectional view showing a tenth step of the method of manufacturing the semiconductor device based on Embodiment 1.

Referring to FIG. 13, the plug conductive layers PL are formed in the contact holes CH. Then, over the insulating film II, the wiring layer ICL is formed so as to be electrically coupled to the respective conductive portions of the individual elements via the plug conductive layers PL.

Thus, the semiconductor device in the embodiment is manufactured.

A description will be given of the function/effect of Embodiment 1.

In Embodiment 1 described above, the insulating film NR is formed over the mask material MK1. Then, over the insulating film NR, the mask material MK2 is formed. When the trenches DTR are formed, the mask material MK2 is used as the hard mask. However, variations in residual film produced at that time can be reset by performing an etching process using the insulating film NR as a stopper. Then, by removing the insulating film NR, the mask material MK1 is exposed. Since variations in the film thickness of the mask material MK1 are small, it is possible to reduce layer-to-layer variations when the contacts are formed. This can suppress variations in transistor characteristic.

Embodiment 2

In Embodiment 2, a description will be given of a method of manufacturing a semiconductor device in the case where a bevel protection mechanism is not provided.

A bevel portion in a semiconductor substrate indicates an inclined portion formed in the peripheral edge of a main surface of a semiconductor substrate (semiconductor wafer). The inclined portion involves a state where the main surface is linearly inclined from the center of the substrate toward the outer end thereof in a cross-sectional shape and a state where the main surface is curvedly inclined from the center of the substrate toward the outer end thereof in a cross-sectional shape.

Figure 14:
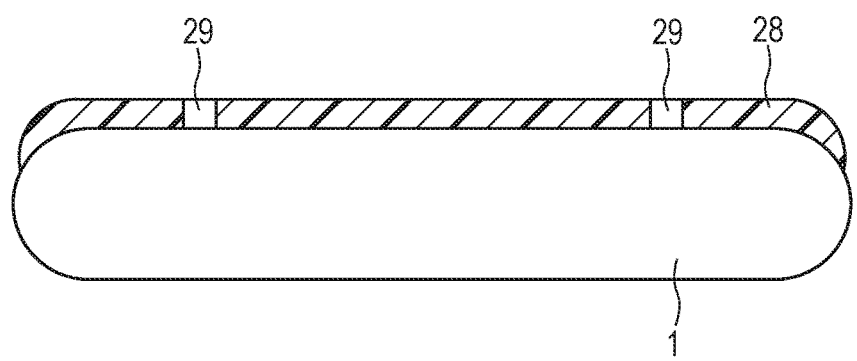
FIG. 14 is a cross-sectional view diagrammatically showing a state where a resist pattern is formed over the upper surface of a semiconductor substrate in a related art example as a comparative example.

FIG. 14 is a cross-sectional view diagrammatically showing a state where a resist pattern is formed over the upper surface of a semiconductor substrate in a related art example as a comparative example.

As shown in FIG. 14, in a resist pattern 28 formed by patterning over the upper surface of the semiconductor substrate 1, openings 29 are formed. Since the resist pattern 28 is formed by applying a fluent material by spin coating, the resist pattern 28 is less likely to be formed over the bevel portions of the semiconductor substrate 1.

Figure 15:
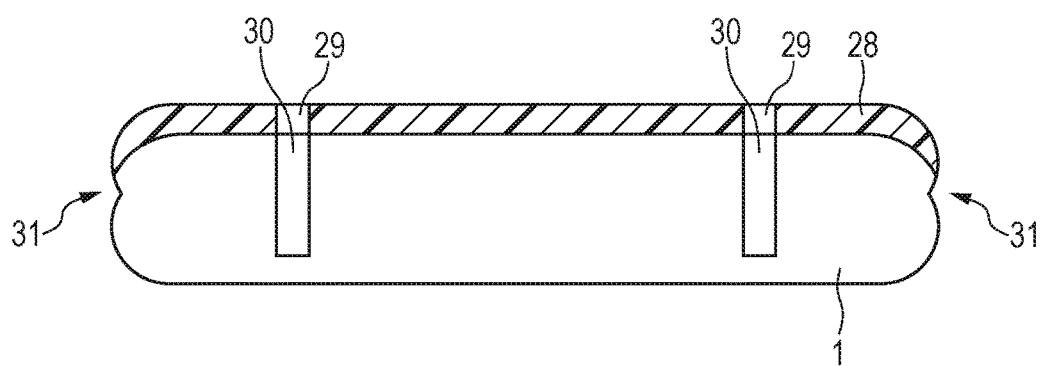
FIG. 15 is a cross-sectional view diagrammatically showing a state where etching has been performed using the resist pattern as a mask.

FIG. 15 is a cross-sectional view diagrammatically showing a state where etching has been performed using the resist pattern as a mask.

As shown in FIG. 15, trenches 30 are formed by etching the semiconductor substrate 1 located immediately under the openings 29 of the resist pattern 28. At this time, the bevel portions of the semiconductor substrate 1 are not covered with the resist pattern 28 and are etched so that significantly protruding/depressed portions 31 are formed. The protruding/depressed portions 31 may be formed to have indented shapes or sharply inclined surfaces. In this case, when the semiconductor substrate 1 is processed in the subsequent step or transported, the protruding/depressed portions 31 having the indented shapes or the sharply inclined surfaces may come off the semiconductor substrate 1 to result in foreign materials having sizes of several tens of micrometers. When the foreign materials adhere to a semiconductor device, the function of the semiconductor device may be degraded thereby.

In Embodiment 2, a description will be given of a method of manufacturing the semiconductor device in which, even when the bevel protection mechanism is not provided, the bevel portions can be protected using a simple and easy process.

Next, a description will be given of the method of manufacturing the semiconductor device based on Embodiment 2 using FIGS. 16 to 25.

A first step of the method of manufacturing the semiconductor device based on Embodiment 2 is the same as the first step illustrated in FIG. 4 in Embodiment 1 so that the detailed description thereof is not repeated.

Figure 16:
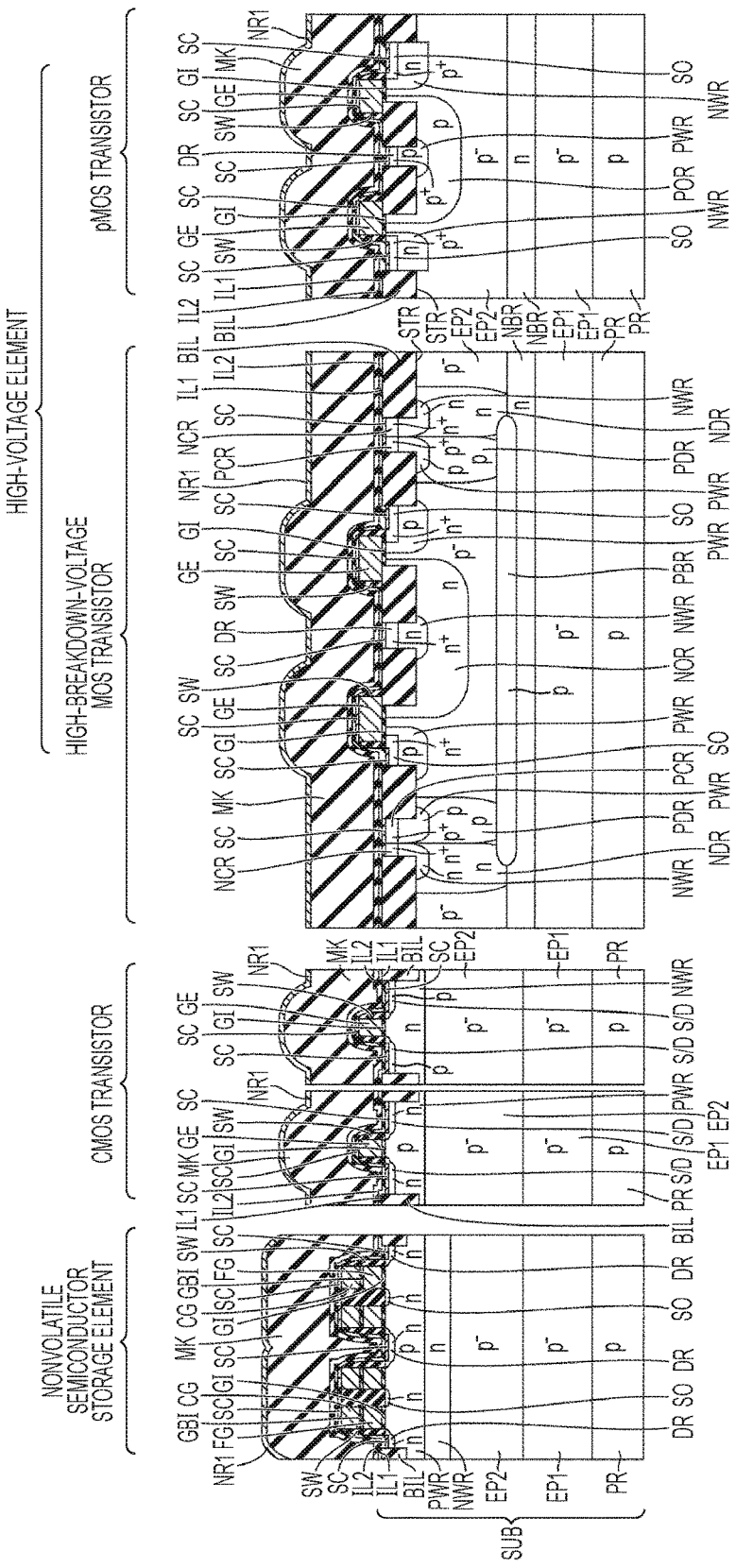
FIG. 16 is a schematic cross-sectional view showing a second step of a method of manufacturing a semiconductor device based on Embodiment 2.

FIG. 16 is a schematic cross-sectional view showing a second step of the method of manufacturing the semiconductor device based on Embodiment 2.

Referring to FIG. 16, the insulating films IL1 and IL2, the mask material MK ("first insulating film"), and an insulating film NR1 ("second insulating film") are successively stacked. The insulating film IL1 is formed of, e.g., a non-doped silicon dioxide film having a thickness of 20 nm. The insulating film IL2 is formed of, e.g., a silicon nitride film having a thickness of 50 cm. The mask material MK is formed of, e.g., a non-doped silicon dioxide film having a thickness of 1000 nm. The insulating film NR1 is formed of, e.g., a silicon nitride film having a thickness of 100 nm. In the present example, the silicon nitride film is described as an example of the insulating film. However, it is also possible to use a silicon oxynitride film, a carbon-containing silicon nitride film, or a silicon carbonitride film instead of the silicon nitride film.

Note that the mask material MK includes a silicon dioxide film (ozone TEOS (Tetra-Ethyl-Ortho-Silicate)) formed by causing an organic material to react in an atmosphere containing ozone and a silicon dioxide film (plasma TEOS) formed by causing an organic material to react in a plasma.

Figure 17:
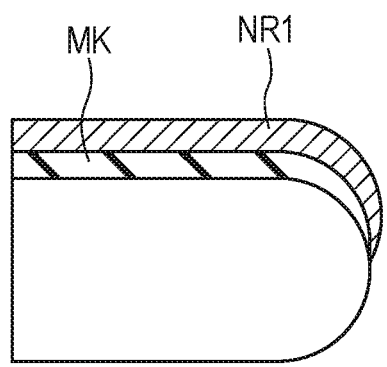
FIG. 17 is a view diagrammatically illustrating the second step of the method of manufacturing the semiconductor device based on Embodiment 2.

FIG. 17 is a view diagrammatically illustrating a second step of the method of manufacturing the semiconductor device based on Embodiment 2.

Referring to FIG. 17, in the second step, the mask material MK is formed over the bevel portions of the semiconductor substrate SUB. The insulating film NR1 is formed over the mask material MK over the bevel portions so as to further cover the bevel portions.

Figure 18:
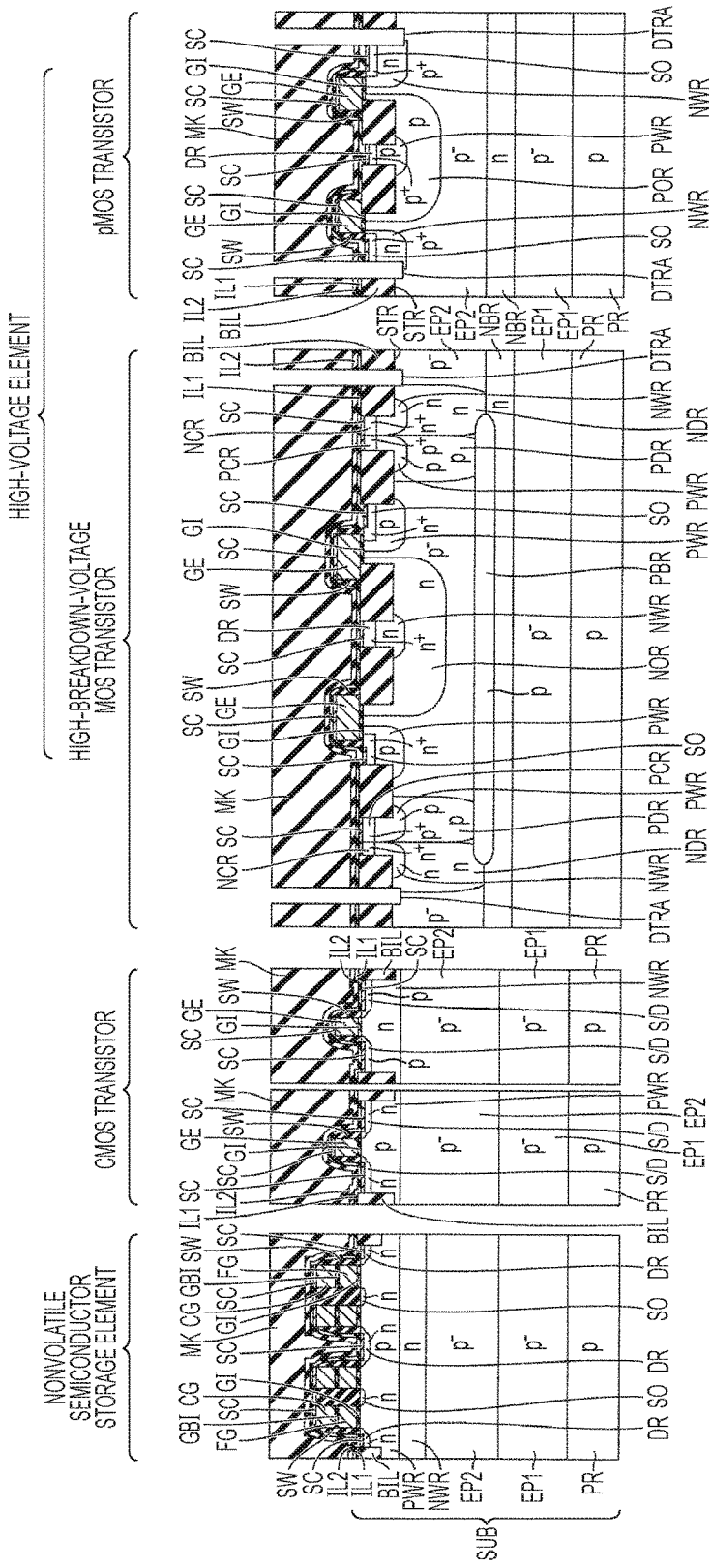
FIG. 18 is a schematic cross-sectional view showing a third step of the method of manufacturing the semiconductor device based on Embodiment 2.

FIG. 18 is a schematic cross-sectional view showing a third step of the method of manufacturing the semiconductor device based on Embodiment 2.

Referring to FIG. 18, the upper surfaces of the insulating film NR1 and the mask MK are polished and removed by, e.g., a CMP (Chemical Mechanical Polishing) method to be planarized.

Figure 19:
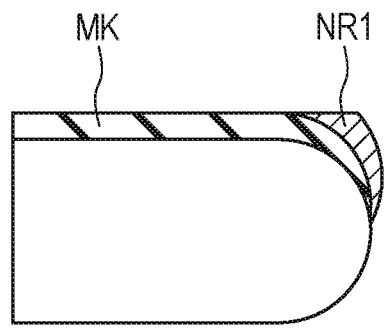
FIG. 19 is a view diagrammatically illustrating the third step of the method of manufacturing the semiconductor device based on Embodiment 2.

FIG. 19 is view diagrammatically illustrating a third step of the method of manufacturing the semiconductor device based on Embodiment 2.

Referring to FIG. 19, in the third step, the upper surfaces of the insulating film NR1 and the mask material MK are polished and removed by a CMP method. As a result, the upper surface of the mask material MK1 is exposed, while the insulating film NR1 remains over the bevel portions of the semiconductor substrate SUB.

Figure 20:
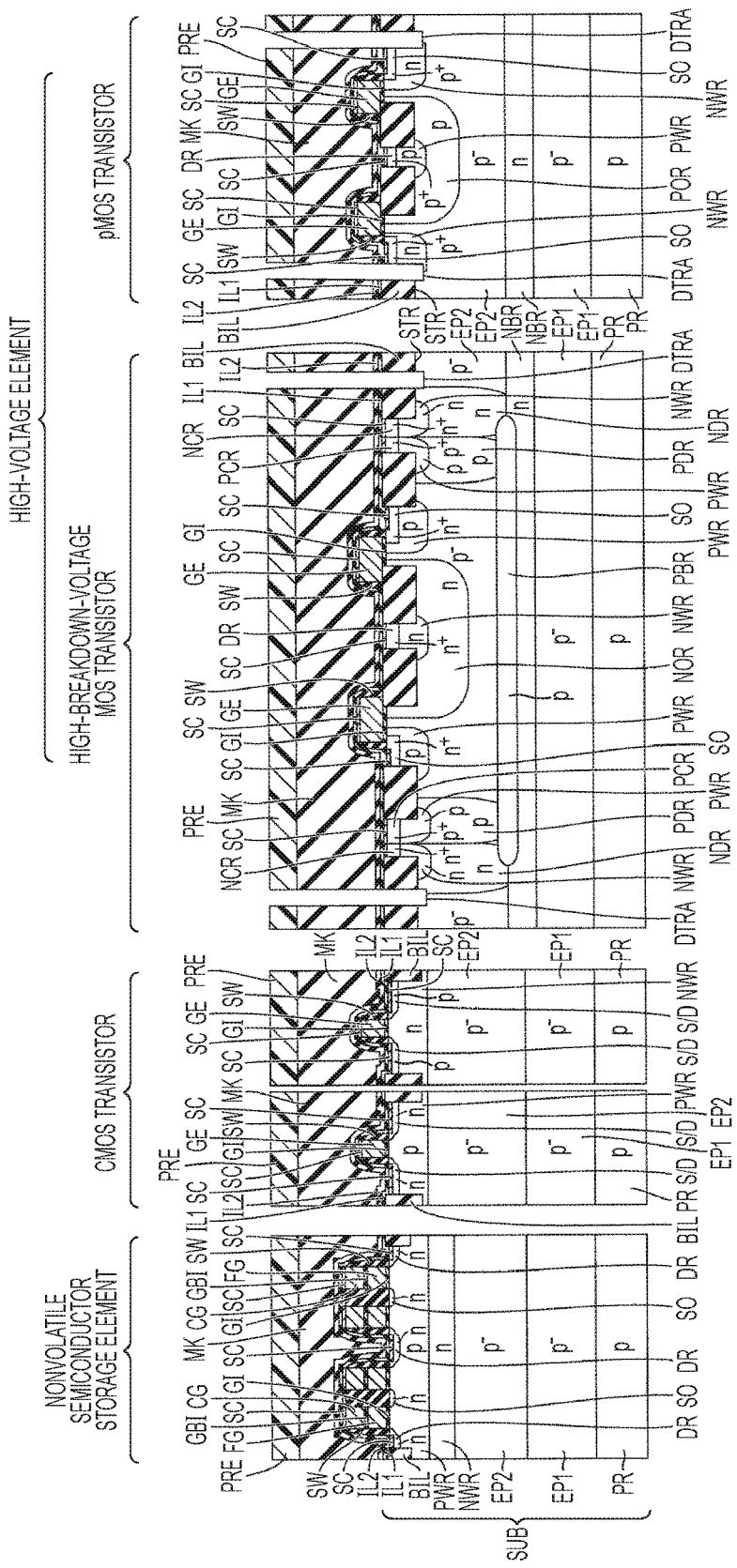
FIG. 20 is a schematic cross-sectional view showing a fourth step of the method of manufacturing the semiconductor device based on Embodiment 2.

FIG. 20 is a schematic cross-sectional view showing a fourth step of the method of manufacturing the semiconductor device based on Embodiment 2.

Referring to FIG. 20, the resist pattern PRE ("photosensitive pattern") is formed by patterning using a typical photomechanical technique. Using the resist pattern PRE formed by the patterning as a mask, the mask material MK, the insulating films IL2 and IL1, and the STI structure are successively anisotropically etched. Thus, the trenches DTRA are formed in the surface of the semiconductor substrate SUB.

Figure 21:
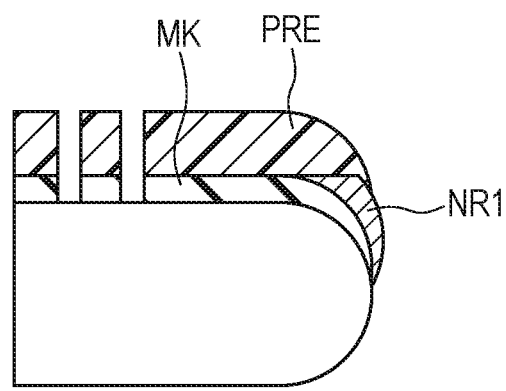
FIG. 21 is a view diagrammatically illustrating the fourth step of the method of manufacturing the semiconductor device based on Embodiment 2.

FIG. 21 is a view diagrammatically illustrating a fourth step of the method of manufacturing the semiconductor device based on Embodiment 2.

Referring to FIG. 21, in the third step, the resist pattern PRE is formed. The resist pattern PRE is not formed over the bevel portions.

Figure 22:
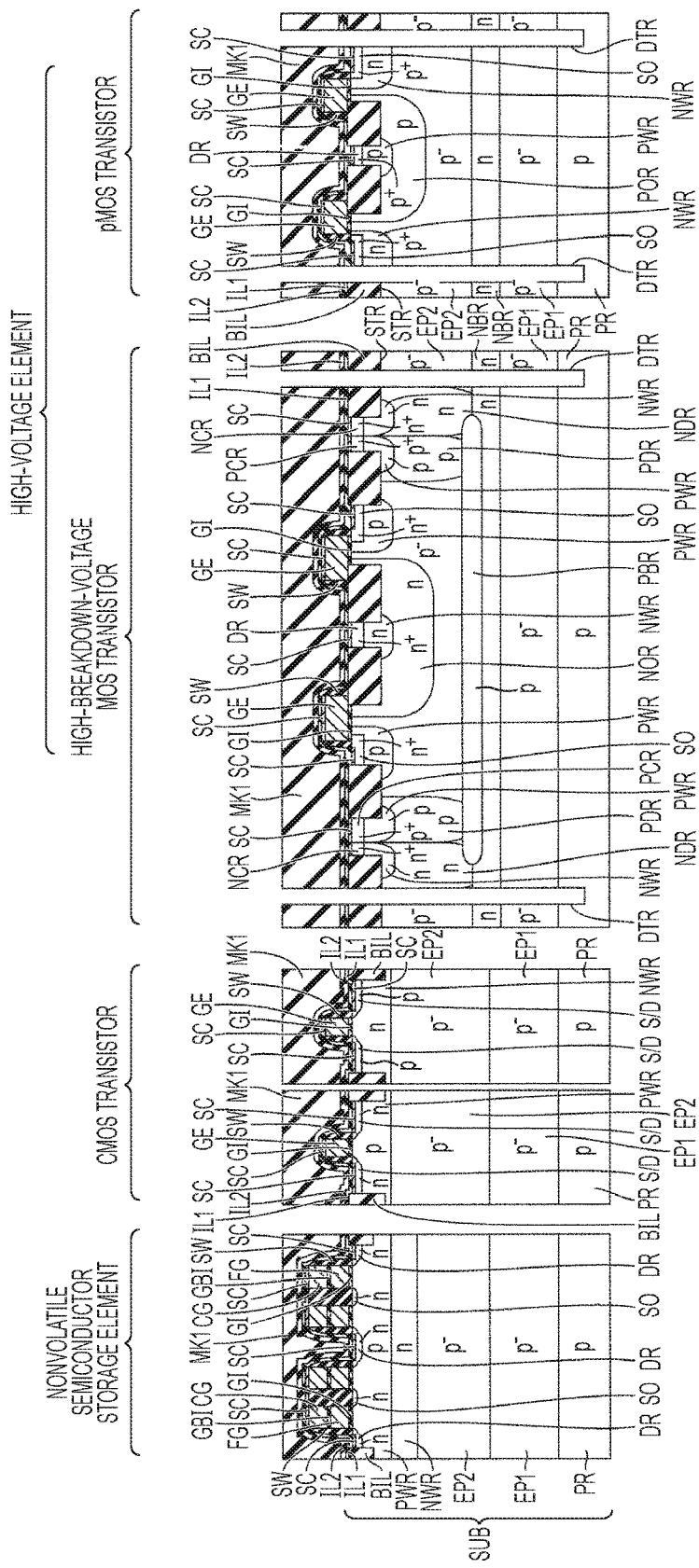
FIG. 22 is a schematic cross-sectional view showing a fifth step of the method of manufacturing the semiconductor device based on Embodiment 2.

FIG. 22 is a schematic cross-sectional view showing a fifth step of the method of manufacturing the semiconductor device based on Embodiment 2.

Referring to FIG. 22, the resist pattern PRE is removed by ashing or the like. As a result, the mask material MK formed under the resist pattern PRE is exposed.

The semiconductor substrate SUB is subjected to anisotropic etching continuously using the mask material UK as a mask. Thus, the trenches DTR are formed to extend from the surface of the semiconductor substrate SUB through the p⁻ epitaxial region EP2, the n-type embedded region NBR, and the p⁻ epitaxial region EP1 and reach the p-type region PR.

Figure 23:
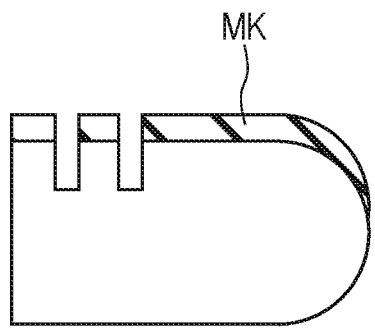
FIG. 23 is a view diagrammatically illustrating the fifth step of the method of manufacturing the semiconductor device based on Embodiment 2.

FIG. 23 is a view diagrammatically illustrating a fifth step of the method of manufacturing the semiconductor device based on Embodiment 2.

Referring to FIG. 23, by ashing or the like, the mask material MK is exposed and the insulating film NR1 remaining over the bevel portions is also removed. The regions corresponding to the bevel portions are anisotropically etched away since the resist pattern PRE is not formed thereover. However, since the insulating film NR1 remaining over the bevel portions of the semiconductor substrate SUB is etched away, the semiconductor substrate SUB is protected.

Figure 24:
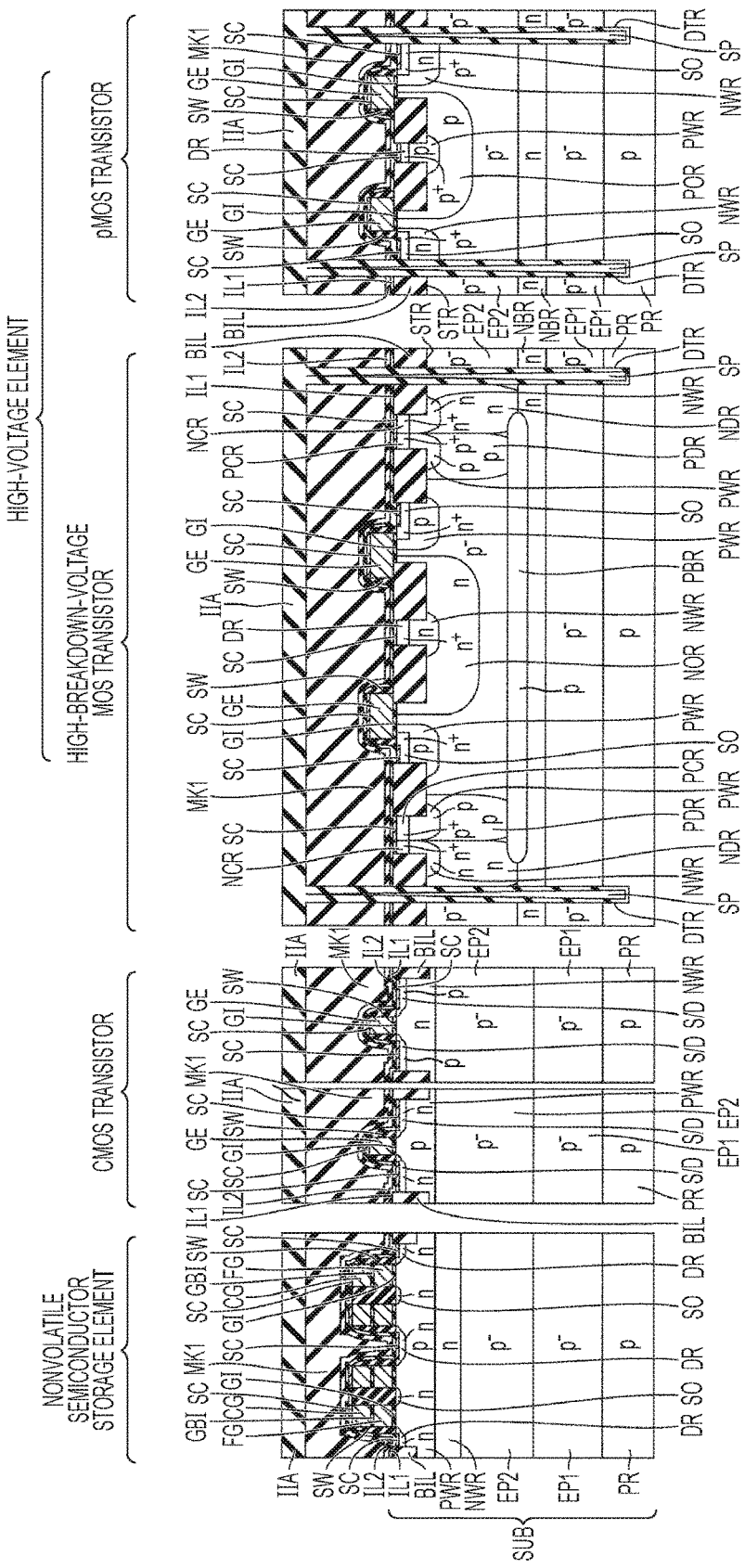
FIG. 24 is a schematic cross-sectional view showing a sixth step of the method of manufacturing the semiconductor device based on Embodiment 2.

FIG. 24 is a schematic cross-sectional view showing a sixth step of the method of manufacturing the semiconductor device based on Embodiment 2.

Referring to FIG. 24, the insulating film IIA is formed over the individual elements and in the trenches DTR so as to cover the individual elements and form the hollows SP in the trenches DTR. The insulating film IIA is formed of, e.g., BP-TEOS having a thickness of, e.g., 1450 nm. The upper surface of the insulating film IIA is planarized by, e.g., a CMP (Chemical Mechanical Polishing) method. As a result, the thickness of the insulating film IIA is reduced to, e.g., 750 nm.

Figure 25:
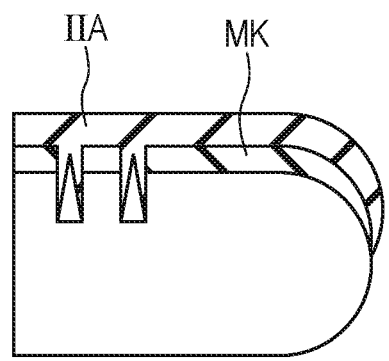
FIG. 25 is a view diagrammatically illustrating the sixth step of the method of manufacturing the semiconductor device based on Embodiment 2.

FIG. 25 is a view diagrammatically illustrating a sixth step of the method of manufacturing the semiconductor device based on Embodiment 2.

Referring to FIG. 25, the insulating film IIA is formed over the mask material MK.

The subsequent process is the same as in the steps illustrated in FIGS. 11 to 13 so that the detailed description thereof is not repeated.

Thus, the semiconductor device in the embodiment is manufactured.

A description will be given of the function/effect of Embodiment 2.

In Embodiment 2 described above, the insulating film NR1 is formed over the mask material MK so as to cover the bevel portions of the semiconductor substrate SUB. The insulating film NR1 remaining over the bevel portions protects the semiconductor substrate SUB during the anisotropic etching and can prevent the bevel portions of the semiconductor substrate SUB from being etched.

Thus, it is possible to prevent the bevel portions of the semiconductor substrate SUB from being formed to have indented shapes or sharply inclined surfaces, inhibit a foreign material from being produced, and reduce the possibility of degrading the function of the semiconductor device.

This also eliminates the need to provide the bevel protection mechanism and provides a cost advantage.

Embodiment 3

In Embodiment 2 described above, the description has been given of the method of manufacturing the semiconductor device when the bevel protection mechanism is not provided and of the case where the trenches are formed by the anisotropic etching in the fifth step, as described above. In the step, the mask material MK corresponding to the predetermined thickness is also removed by etching and the film thickness of the mask material MK may vary in a wafer plane.

In Embodiment 3, a description will be given of a method of manufacturing a semiconductor device which can protect the bevel portions using a simple and easy process even when the bevel protection mechanism is not provided and also suppress variations in transistor characteristic.

Next, the description will be given of the method of manufacturing the semiconductor device based on Embodiment 3 using FIGS. 26 to 35.

A first step of the method of manufacturing the semiconductor device based on Embodiment 3 is the same as the first step illustrated in FIG. 4 in Embodiment 1 so that the detailed description thereof is not repeated.

Figure 26:
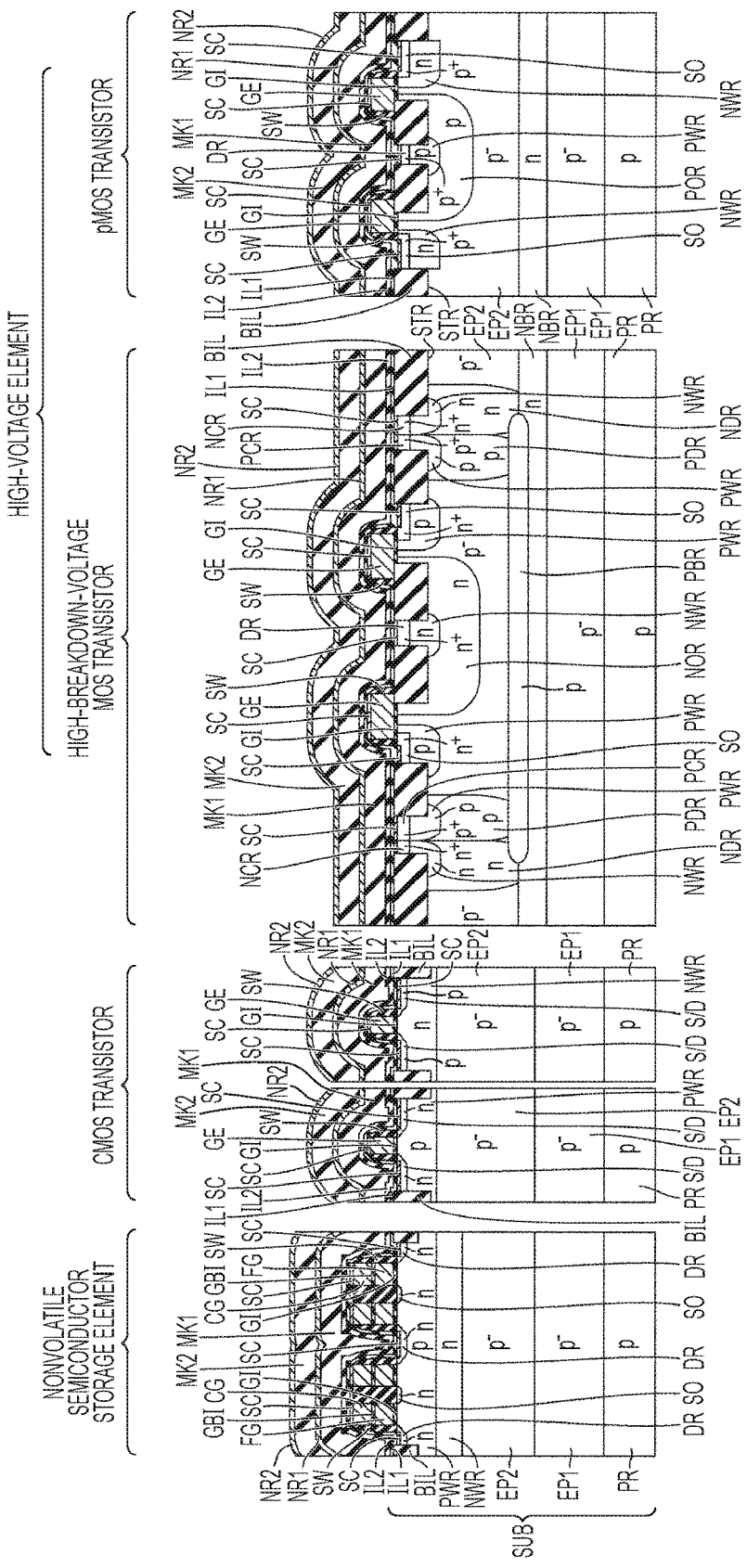
FIG. 26 is a schematic cross-sectional view showing a second step of a method of manufacturing a semiconductor device based on Embodiment 3.

FIG. 26 is a schematic cross-sectional view showing a second step of the method of manufacturing the semiconductor device based on Embodiment 3.

Referring to FIG. 26, the insulating films IL1 and IL2, the mask material MK1, the insulating film NR1, the mask material MK2 ("third insulating film"), and an insulating film NR2 ("fifth insulating film") are stacked successively so as to cover the individual elements. The insulating film IL1 is formed of, e.g., a non-doped silicon dioxide film having a thickness of 20 nm. The insulating film IL2 is formed of, e.g., a silicon nitride film having a thickness of 50 nm.

The mask material MK1 is formed of, e.g., a non-doped silicon dioxide film having a thickness of 200 nm. The insulating film NR1 is formed of, e.g., a silicon nitride film having a thickness of 50 nm. The mask material MK2 is formed of, e.g., a non-doped silicon dioxide film having a thickness of 800 nm. The insulating film NR2 is formed of, e.g., a silicon nitride film having a thickness of 100 nm.

In the present example, the silicon nitride film will be described as an example of the insulating film. However, it is also possible to use a silicon oxynitride film, a carbon-containing silicon nitride film, or a silicon carbonitride film instead of the silicon nitride film.

Figure 27:
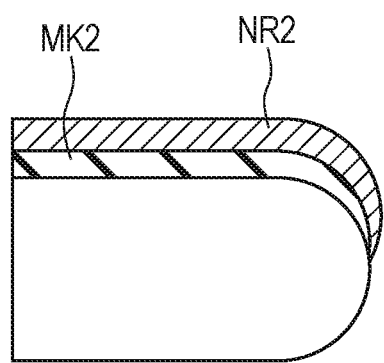
FIG. 27 is a view diagrammatically illustrating the second step of the method of manufacturing the semiconductor device based on Embodiment 3.

FIG. 27 is a view diagrammatically illustrating a second step of the method of manufacturing the semiconductor device based on Embodiment 3.

Referring to FIG. 27, in the second step, the mask material MK1, the insulating film NR1, and the mask material MK2 are formed over the bevel portions of the semiconductor substrate SUB. The insulating film NR2 is formed over the mask material MK2 over the bevel portions so as to further cover the bevel portions. Note that, for easier understanding, the mask material MK2 and the insulating film NR2 provided thereover are shown herein.

Figure 28:
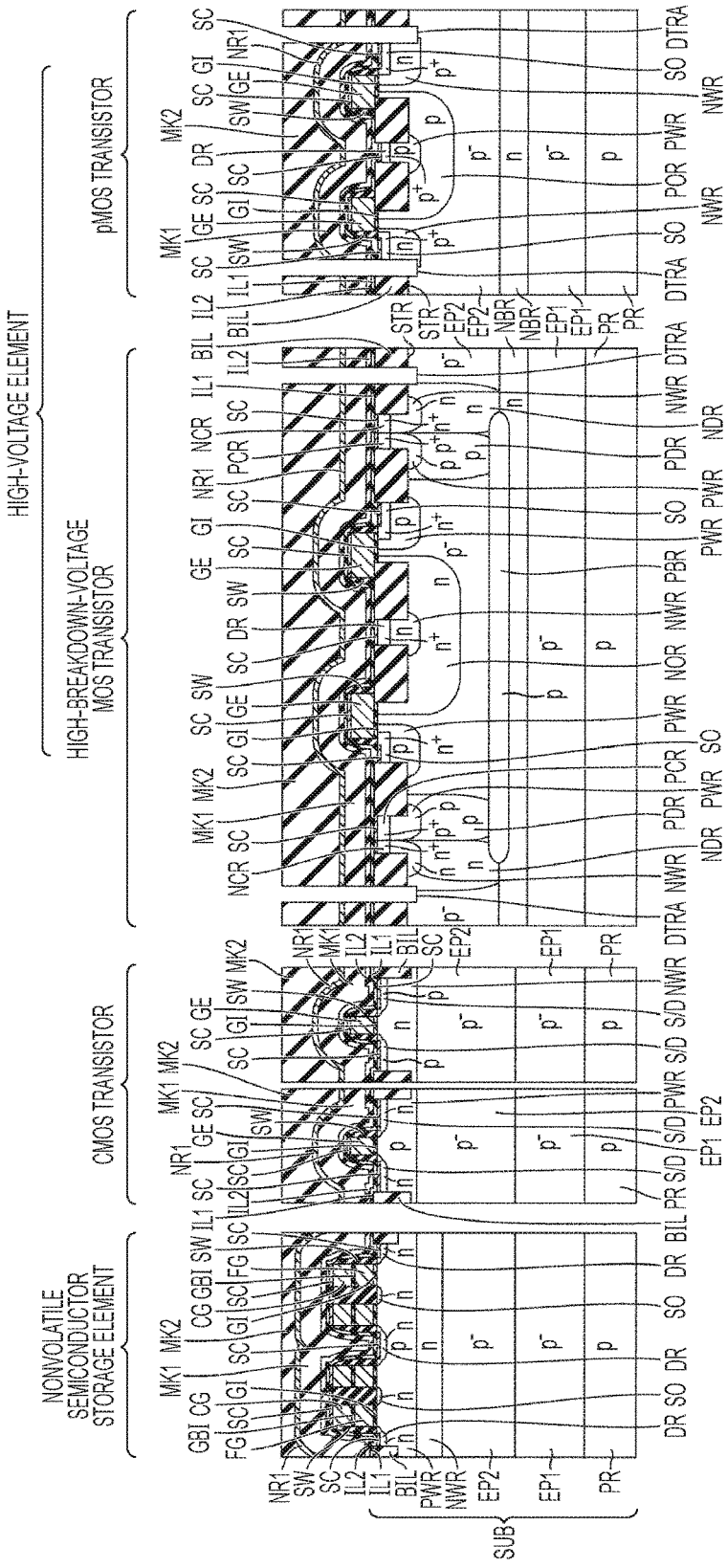
FIG. 28 is a schematic cross-sectional view showing a third step of the method of manufacturing the semiconductor device based on Embodiment 3.

FIG. 28 is a schematic cross-sectional view showing a third step of the method of manufacturing the semiconductor device based on Embodiment 3.

Referring to FIG. 28, the upper surfaces of the insulating film NR2 and the mask material MK2 are polished and removed by, e.g., a CMP (Chemical Mechanical Polishing) method.

Figure 29:
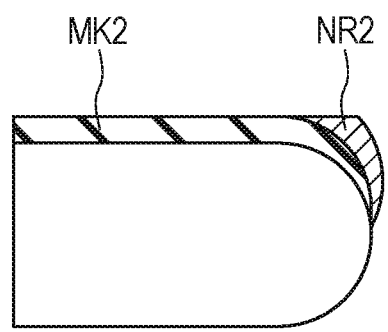
FIG. 29 is a view diagrammatically illustrating the third step of the method of manufacturing the semiconductor device based on Embodiment 3.

FIG. 29 is a view diagrammatically illustrating the third step of the method of manufacturing the semiconductor device based on Embodiment 3.

Referring to FIG. 29, in the third step, the upper surfaces of the insulating film NR2 and the mask material MK2 are polished and removed by a CMP method. As a result, the upper surface of the mask material MK2 is exposed, while the insulating film NR2 remains over the bevel portions of the semiconductor substrate SUB.

Figure 30:
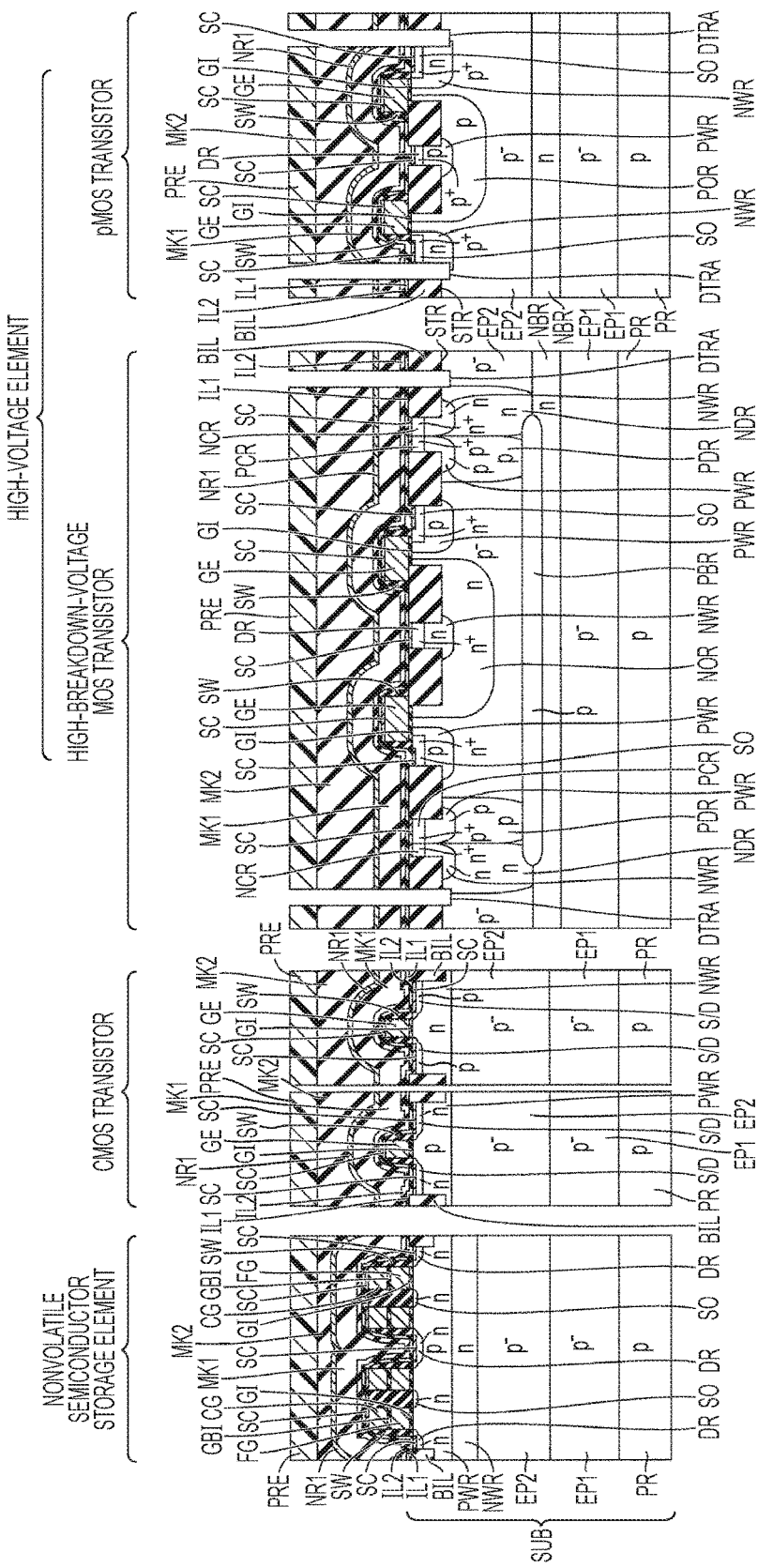
FIG. 30 is a schematic cross-sectional view showing a fourth step of the method of manufacturing the semiconductor device based on Embodiment 3.

FIG. 30 is a schematic cross-sectional view showing a fourth step of the method of manufacturing the semiconductor device based on Embodiment 3.

Referring to FIG. 30, the resist pattern PRE is formed by patterning using a typical photomechanical technique. Using the resist pattern (photosensitive pattern) PRE formed by the patterning as a mask, the mask material MK2, the insulating film NR1, the mask material MK1, the insulating films IL2 and IL1, and the STI structure are successively anisotropically etched. Thus, the trenches DTRA are formed in the surface of the semiconductor substrate SUB to extend through the mask material MK2, the insulating film NR1, and the insulating films IL2 and IL1.

Figure 31:
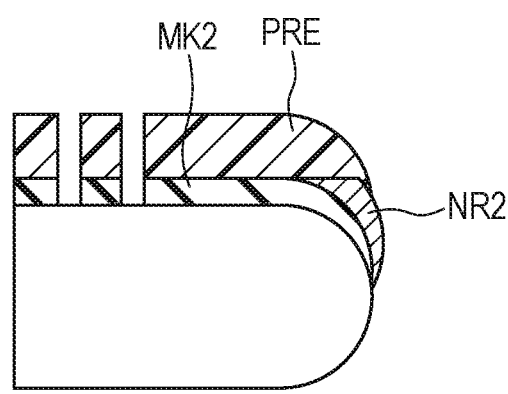
FIG. 31 is a view diagrammatically illustrating the fourth step of the method of manufacturing the semiconductor device based on Embodiment 3.

FIG. 31 is a view diagrammatically illustrating the fourth step of the method of manufacturing the semiconductor device based on Embodiment 3.

Referring to FIG. 31, in the third step, the resist pattern PRE is formed but, over the bevel portions, the resist pattern PRE is not formed.

Figure 32:
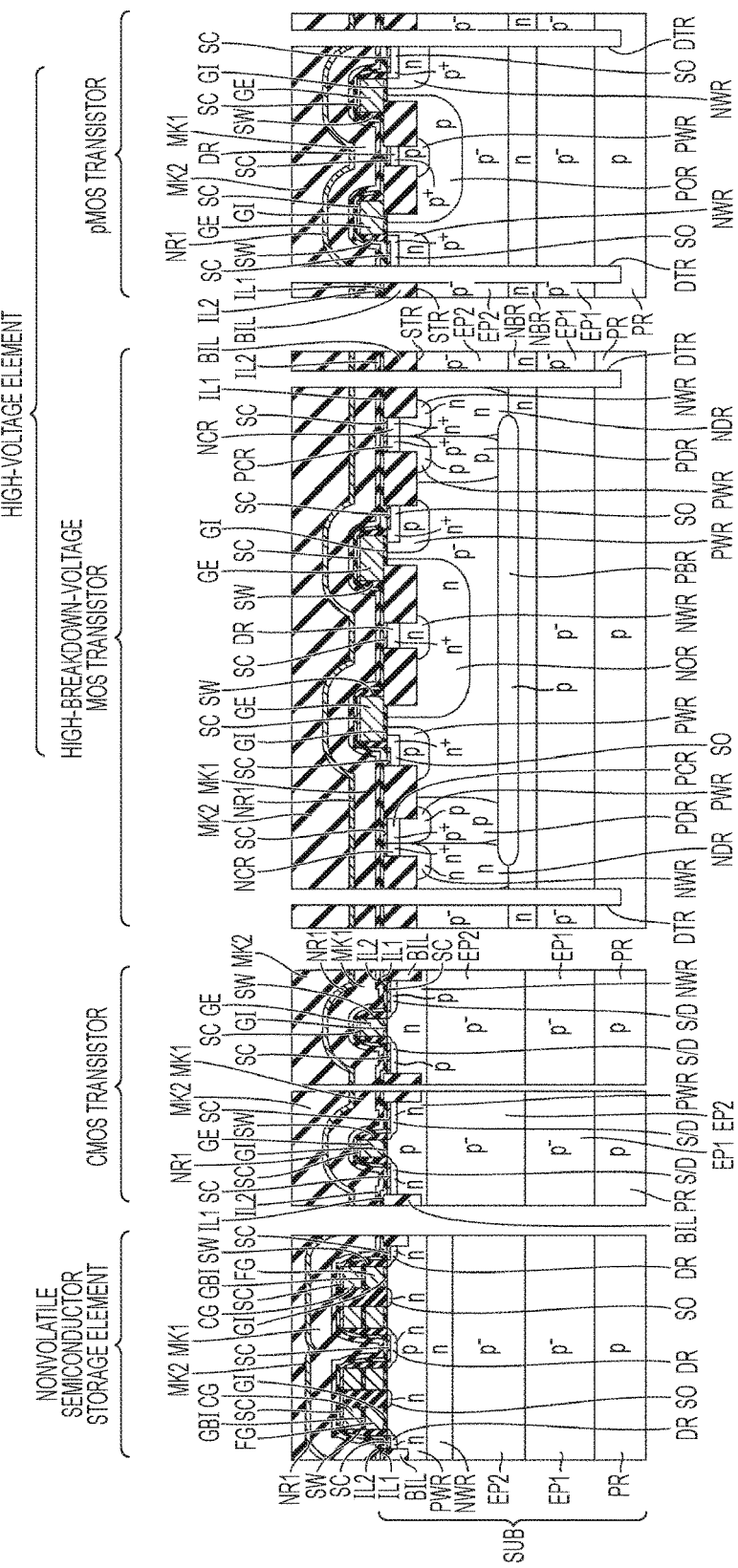
FIG. 32 is a schematic cross-sectional view showing a fifth step of the method of manufacturing the semiconductor device based on Embodiment 3.

FIG. 32 is a schematic cross-sectional view showing a fifth step of the method of manufacturing the semiconductor device based on Embodiment 3.

Referring to FIG. 32, the resist pattern PRE is removed by ashing or the like. As a result, the mask material MK2 formed under the resist pattern PRE is exposed.

The semiconductor substrate SUB is subjected to anisotropic etching continuously using the mask material MK2 as a mask. Thus, the trenches DTR are formed to extend from the surface of the semiconductor substrate SUB through the p epitaxial region EP2, the n-type embedded region NBR, and the p epitaxial region EP1 and reach the p-type region PR.

Figure 33:
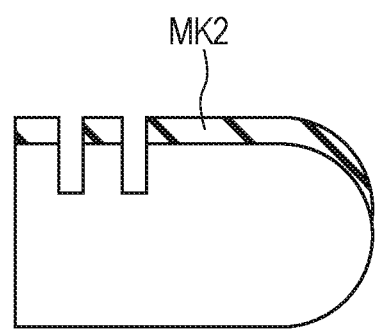
FIG. 33 is a view diagrammatically illustrating the fifth step of the method of manufacturing the semiconductor device based on Embodiment 3.

FIG. 33 is a view diagrammatically illustrating a fifth step of the method of manufacturing the semiconductor device based on Embodiment 3.

Referring to FIG. 33, the mask material MK2 is exposed by ashing or the like and the insulating film NR1 remaining over the bevel portions is also removed. The regions corresponding to the bevel portions are anisotropically etched away since the resist pattern PRE is not formed thereover. However, since the insulating film NR1 remaining over the bevel portions of the semiconductor substrate SUB is etched away, the semiconductor substrate SUB is protected.

Figure 34:
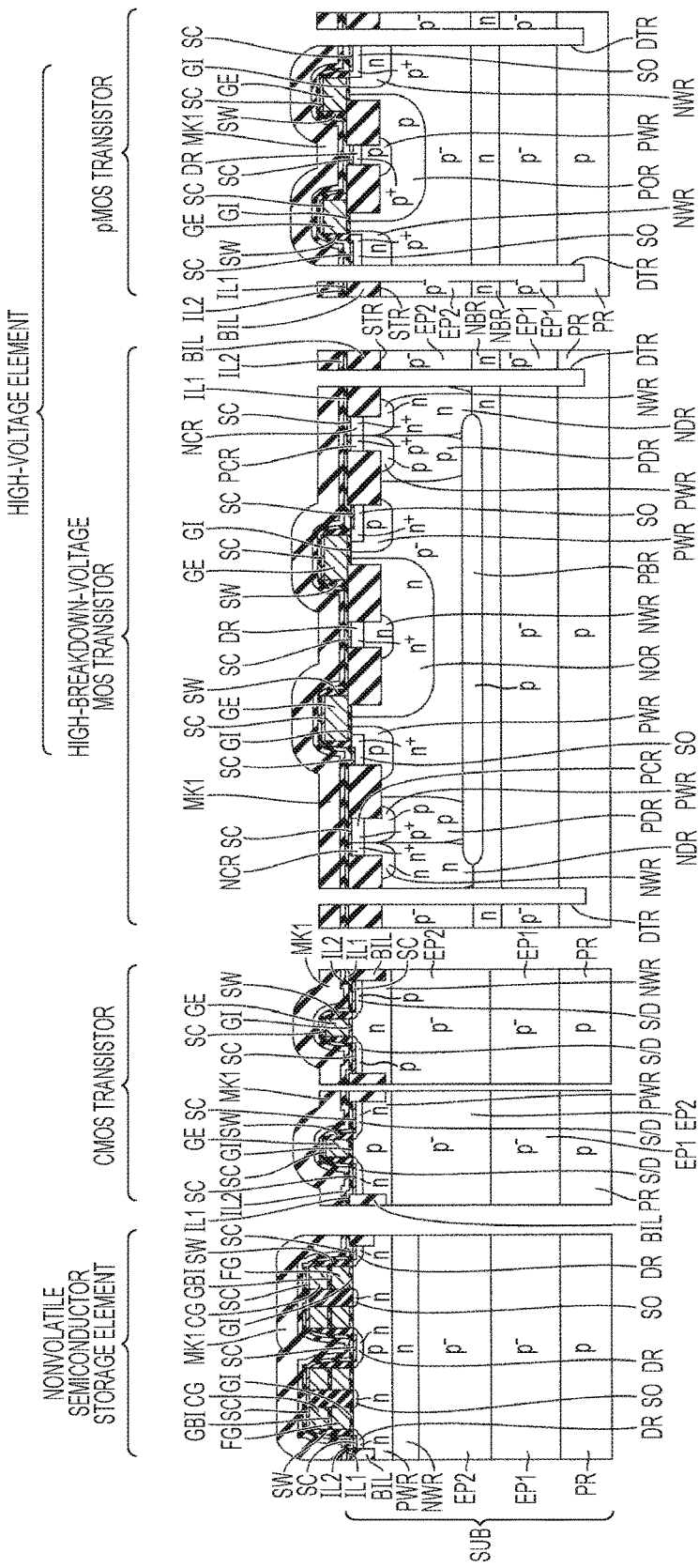
FIG. 34 is a schematic cross-sectional view showing a sixth step of the method of manufacturing the semiconductor device based on Embodiment 3.

FIG. 34 is a schematic cross-sectional view showing a sixth step of the method of manufacturing the semiconductor device based on Embodiment 3.

Referring to FIG. 34, the mask material MK2 is removed by anisotropic etching, while the insulating film NR1 is removed by isotropic etching or anisotropic etching. Note that the anisotropic etching is performed by dry etching. Note that the isotropic etching is performed by dry or wet etching.

The removal of the mask material MK2 is performed using the insulating film NR1 as a stopper. The removal of the insulating film NR1 is performed using the mask material MK1 as a stopper.

By removing the mask material MK2 and the insulating film. NR1, it is possible to reset variations in the residual film of a hard mask when etching is performed using the mask material MK2 as a mask to form the trenches DTR in the fifth step described above.

As a result of removing the mask material MK2 and the insulating film NR1 each described above, the upper surface of the mask material MK1 is exposed. However, since the mask material MK2 is removed by anisotropic etching, the embedded insulating film BIL of the STI structure exposed at the wall surfaces of the trenches DTR are not reduced in a lateral direction in the drawing (does not recede).

Figure 35:
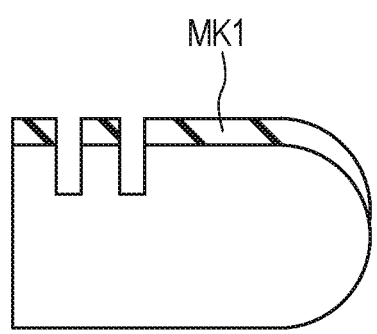
FIG. 35 is a view diagrammatically illustrating the sixth step of the method of manufacturing the semiconductor device based on Embodiment 3.

FIG. 35 is a view diagrammatically illustrating a sixth step of the method of manufacturing the semiconductor device based on Embodiment 3.

Referring to FIG. 35, by removing the mask material MK2 and the insulating film NR1, the mask material MK1 is exposed over the semiconductor substrate SUB.

The subsequent process is the same as in the steps illustrated in FIGS. 10 to 13 so that the detailed description thereof is not repeated.

Thus, the semiconductor device in the embodiment is manufactured.

A description will be given of the function/effect of Embodiment 3.

In Embodiment 3 described above, over the bevel portions of the semiconductor substrate SUB, the mask material MK2 is formed. Then, over the mask material MK2, the insulating film NR2 is formed so as to cover the bevel portions. Over the insulating film NR2, the resist pattern is formed. Using the resist pattern as a mask, the trenches are formed. During the anisotropic etching for forming the trenches, the insulating film NR2 remaining over the bevel portions protects the bevel portions to be able to prevent the bevel portions of the semiconductor substrate SUB from being etched.

Thus, it is possible to prevent the bevel portions of the semiconductor substrate SUB from being formed to have indented shapes or sharply inclined surfaces, inhibit a foreign material from being produced, and reduce the possibility of degrading the function of the semiconductor device.

This also eliminates the need to provide the bevel protection mechanism and provides a cost advantage.

In Embodiment 3 described above, the insulating film NR1 is formed over the mask material MK1. Then, over the insulating film NR1, the mask material MK2 is formed. When the trenches DTR are formed, the mask material MK2 is used as a hard mask, resulting in variations in residual film. However, the variations in residual film can be reset by performing the etching process using the insulating film NR1 as the stopper. Then, the insulating film NR1 is removed to expose the mask material MK1. Since variations in the film thickness of the mask material MK1 are small, it is possible to reduce layer-to-layer variations when the contacts are formed. This can suppress variations in transistor characteristic.

Embodiment 4

In Embodiment 1 described above, the description has been given of the method of reducing variations in residual, film when the mask material is used as the hard mask.

In Embodiment 4, a description will be given of a method of suppressing variations in transistor characteristic using a simpler and easier method.

Next, a description will be given of a method of manufacturing a semiconductor device based on Embodiment 4 using FIGS. 36 to 38.

A first step of the method of manufacturing the semiconductor device based on Embodiment 4 is the same as the first step illustrated in FIG. 4 in Embodiment 1 so that the detailed description thereof is not repeated.

Figure 36:
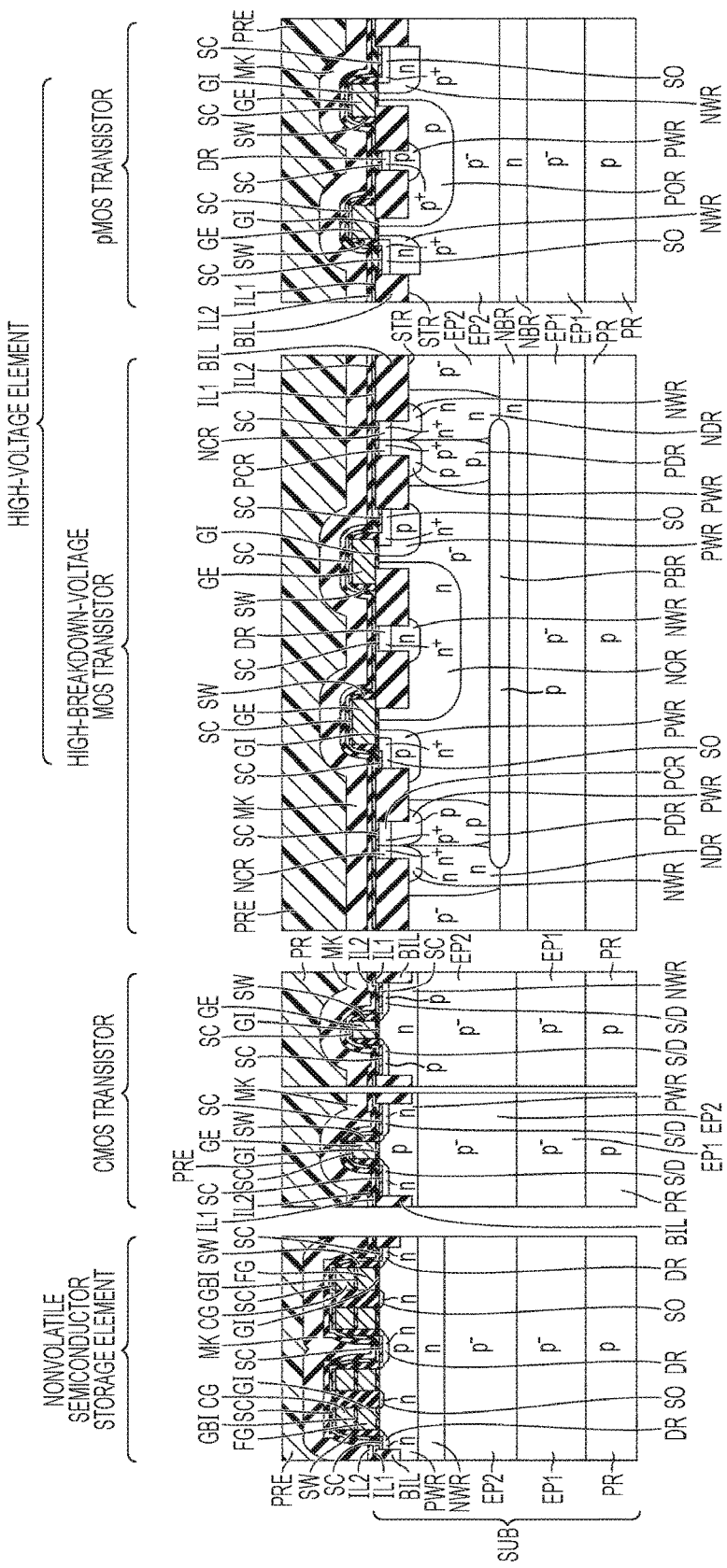
FIG. 36 is a schematic cross-sectional view showing a second step of a method of manufacturing a semiconductor device based on Embodiment 4.

FIG. 36 is a schematic cross-sectional view showing a second step of the method of manufacturing the semiconductor device based on Embodiment 4.

Referring to FIG. 36, the insulating films IL1 and IL2, the mask material MK ("first insulating film"), and the resist pattern PRE ("photosensitive pattern") are successively stacked so as to cover the individual elements. The insulating film. IL1 is formed of, e.g. a non-doped silicon dioxide film having a thickness of 20 nm. The insulating film IL2 is formed of, e.g., a silicon nitride film having a thickness of 50 nm.

The mask material MK is formed of, e.g., a non-doped silicon dioxide film having a thickness of 200 nm.

Figure 37:
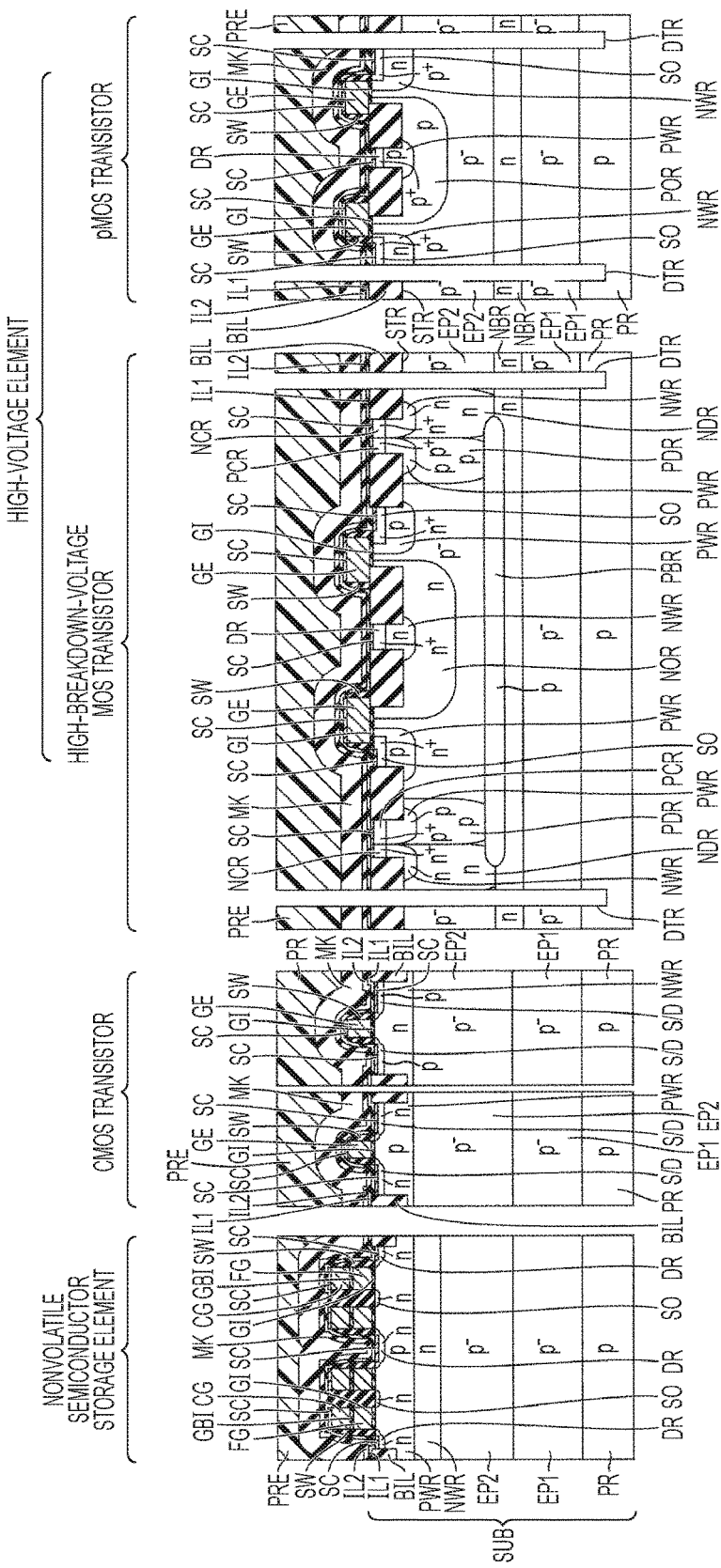
FIG. 37 is a schematic cross-sectional view showing a third step of the method of manufacturing the semiconductor device based on Embodiment 4.

FIG. 37 is a schematic cross-sectional view showing a third step of the method of manufacturing the semiconductor device based on Embodiment 4.

Referring to FIG. 37, the resist pattern PRE is formed by patterning using a typical photomechanical technique. Using the resist pattern (photosensitive pattern) PRE formed by the patterning as a mask, the mask material MK, the insulating films IL2 and IL1, the STI structure, and the semiconductor substrate SUB are successively anisotropically etched. Thus, the trenches DTR are formed to extend from the surface of the semiconductor substrate SUB through the p$^-$ epitaxial region EP2, the n-type embedded region NBR, and the p$^-$ epitaxial region EP1 in the substrate to the p-type region PR. Note that, when the trenches DTR each having a high aspect ratio as a ratio of a depth to a width are formed, an etching process using a so-called Bosch process is performed. For example, the step of etching the semiconductor substrate SUB using a gas including a sulfur hexafluoride (SF$_6$) gas and the step of covering the side surfaces of the trenches DTR using a gas including a carbon fluoride (fluorocarbon) gas such as, e.g., a C$_4$F$_8$ gas are repeated.

Figure 38:
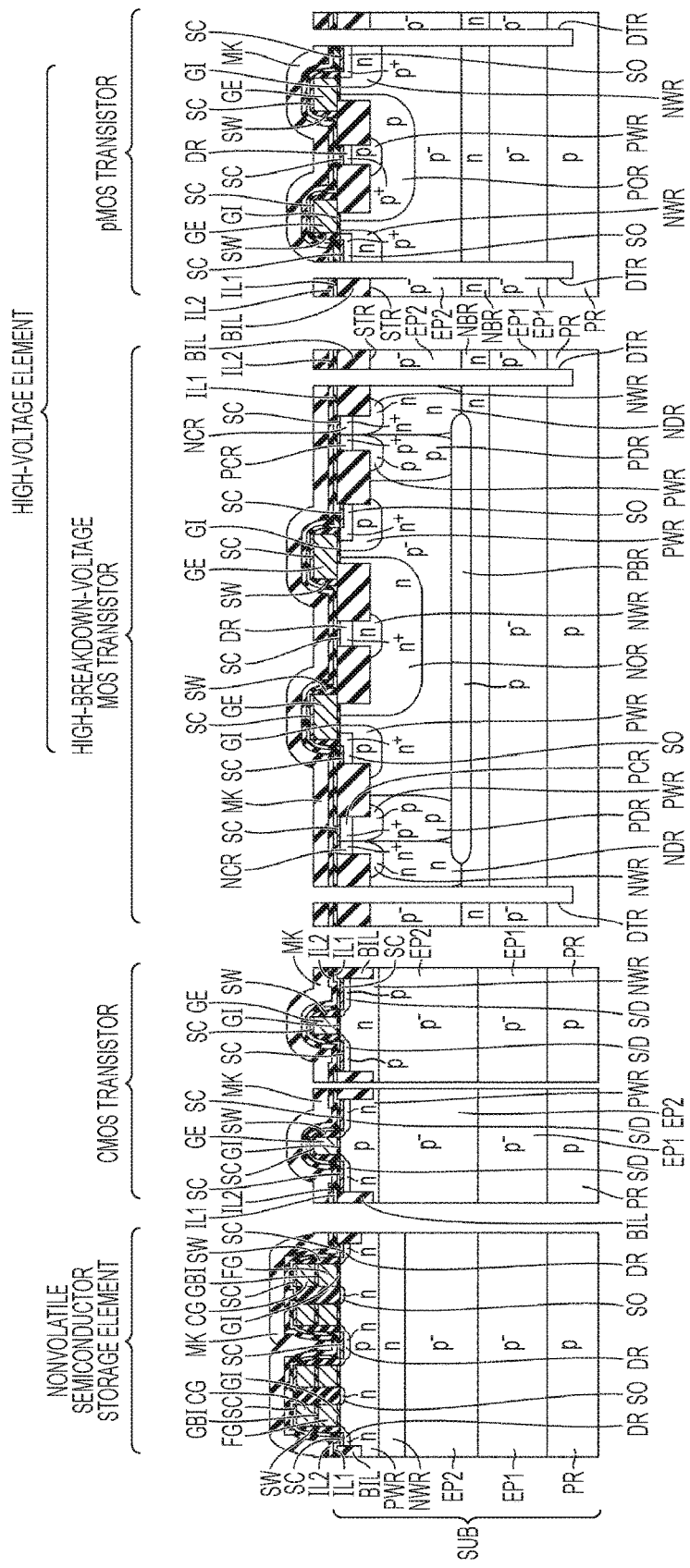
FIG. 38 is a schematic cross-sectional view showing a fourth step of the method of manufacturing the semiconductor device based on Embodiment 4.

FIG. 38 is a schematic cross-sectional view showing a fourth step of the method of manufacturing the semiconductor device based on Embodiment 4.

Referring to FIG. 38, the resist pattern PRE is removed by ashing or the like. As a result, the mask material MK formed under the resist pattern PRE is exposed.

The subsequent process is the same as in the steps illustrated in FIGS. 10 to 13 so that the detailed description thereof is not repeated.

Thus, the semiconductor device in the embodiment is manufactured.

A description will be given of the function/effect of Embodiment 4.

In Embodiment 4 described above, the trenches DTR are formed using the resist pattern PRE as a mask.

Accordingly, the etching process using the mask material MK as a hard mask is not performed. This causes no variation in residual film at that time and can reduce layer-to-layer variations during the formation of the contacts. As a result, it is possible to suppress variations in transistor characteristic.

In addition, since the semiconductor device can be manufactured using a simpler and easier process than in each of the embodiments described above, the cost of a manufacturing process can be reduced.

Note that, in the second step described above, it may also be possible to perform planarization using a CMP method before the resist pattern PRE is stacked over the mask material MK and then form the resist pattern PRE. This can planarize the underlie and stabilize the shape of the resist pattern PRE.

Embodiment 5

In Embodiment 4, a description will be given of the simple and easy manufacturing process described above in Embodiment 4 as well as a method of manufacturing a semiconductor device which allows the bevel portions to be protected using a simple and easy process even when the bevel protection mechanism is not provided.

First to third steps of the method of manufacturing the semiconductor device based on Embodiment 5 are the same as the steps in FIGS. 16 to 19 illustrated in Embodiment 2.

A fourth step of the method of manufacturing the semiconductor device based on Embodiment 5 is such that, in the fourth step in FIG. 20 described in Embodiment 2, using the resist pattern PRE as a mask, the mask material MK, the insulating films IL2 and IL1, the STI structure, and the semiconductor substrate SUB are successively anisotropically etched, as described in Embodiment 4. Thus, the trenches DTR are formed to extend from the surface of the semiconductor substrate SUB through the p epitaxial region EP2, the n-type embedded region NBR, and the p epitaxial region EP1 and reach the p-type region PR.

When the trenches DTR each having a high aspect ratio as a ratio of a depth to a width are formed, an etching process using a so-called Bosch process is performed. For example, the step of etching the semiconductor substrate SUB using a gas including a sulfur hexafluoride (SF$_6$) gas and the step of covering the side surfaces of the trenches DTR using a gas including a carbon fluoride (fluorocarbon) gas such as, e.g., a C$_4$F$_8$ gas are repeated.

The process steps including and subsequent to the fifth step are basically the same as the steps illustrated in FIGS.

22 and 25 described in Embodiment 2 so that the detailed description thereof is not repeated. Note that, in Embodiment 5, the trenches DTR are formed using the resist pattern PRE as a mask so that the etching process using the mask material MK as the hard mask in the fifth step in Embodiment 2 is not performed.

Thus, the semiconductor device in Embodiment 5 is manufactured.

A description will be given of the function/effect of Embodiment 5.

In Embodiment 5 described above, using the resist pattern PRE as the mask, the trenches DTR are formed.

Accordingly, the etching process using the mask material MK as the hard mask is not performed. This causes no variation in residual film at that time and can reduce layer-to-layer variations during the formation of the contacts. As a result, it is possible to suppress variations in transistor characteristic.

In addition, the insulating film NR1 is formed over the mask material MK so as to cover the bevel portions of the semiconductor substrate SUB. The insulating film NR1 remaining over the bevel portions protects the semiconductor substrate SUB during the anisotropic etching and can prevent the bevel portions of the semiconductor substrate SUB from being etched.

Thus, it is possible to prevent the bevel portions of the semiconductor substrate SUB from being formed to have indented shapes or sharply inclined surfaces and reduce the possibility of degrading the function of the semiconductor device.

This also eliminates the need to provide the bevel protection mechanism and provides a cost advantage.

Embodiment 6

In each of the embodiments described above, the description has been given of the case where the hollow SP is formed to extend from the mask material MK as the upper end thereof into each of the trenches DTR.

On the other hand, by lowering the position of each of the hollows SP, it is possible to thin the contact interlayer film. Thus, it is possible to prevent a failure in forming the contacts and thus reduce variations in transistor characteristic.

In Embodiment 6, a description will be given of a method of manufacturing a semiconductor device which further enhances a transistor characteristic.

The manufacturing method in Embodiment 6 further has an additional step of removing the mask material MK1 prior to the formation of the hollows SP.

Figure 39:
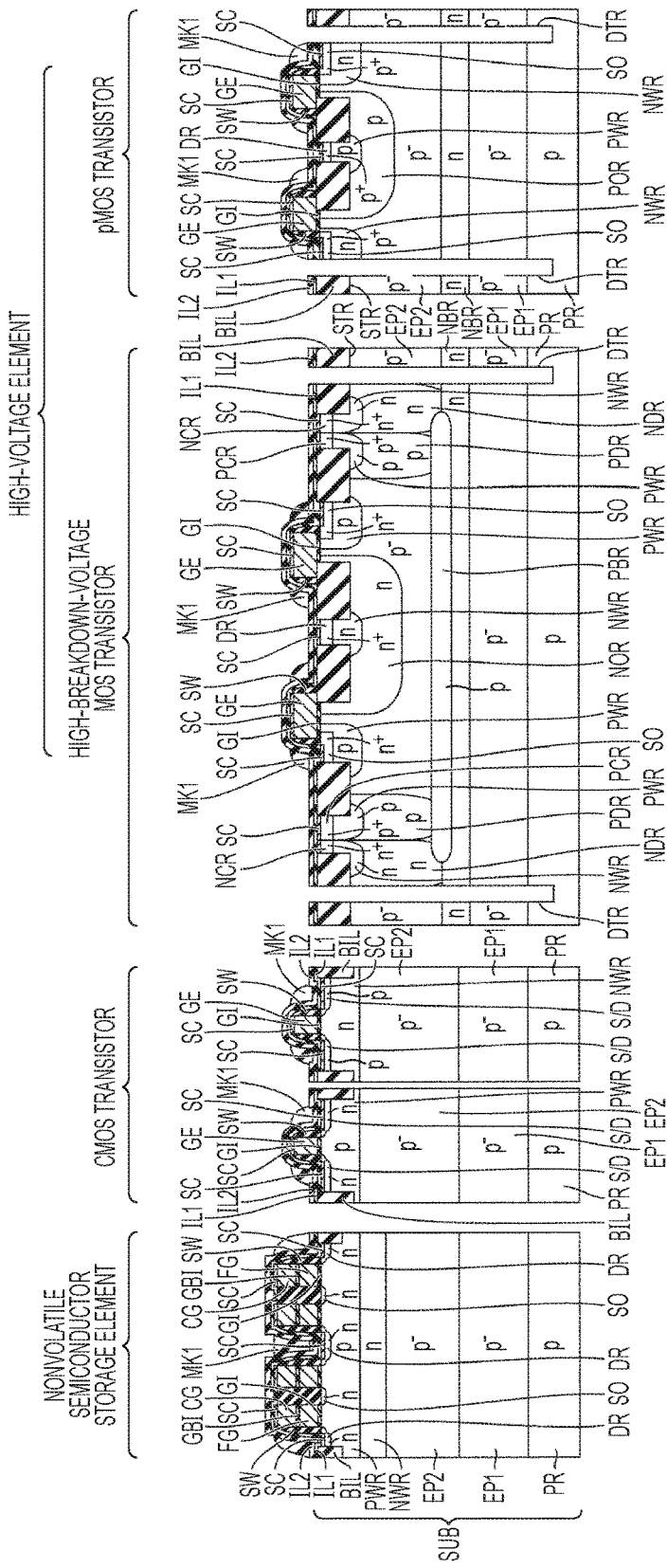
FIG. 39 is a schematic cross-sectional view showing an additional step of a method of manufacturing the semiconductor device based on Embodiment 6.

FIG. 39 is a schematic cross-sectional view showing the additional step of the method of manufacturing the semiconductor device based on Embodiment 6.

First to sixth steps of the method of manufacturing the semiconductor device based on Embodiment 6 are the same as the steps in FIGS. 4 to 9 described in Embodiment 1.

Referring to FIG. 39, the mask material MK1 is removed by anisotropic etching. Specifically, the mask material MK1 located over the side walls of the gate electrode layers GE and between the gate electrodes is left, while the mask material MK1 is removed from the other region. Thus, the mask material MK1 is removed from around the trenches DTR.

This can lower the position of the upper end of the hollow SP formed in each of the trenches DTR.

Note that anisotropic etching is performed by dry etching. Preferably, the anisotropic etching is performed until the position of the upper end of the mask material MK1 remaining over the side walls of the gate electrode layers GE is located below the upper ends of the gate electrode layers GE.

The process steps including and subsequent to a seventh step are basically the same as the steps illustrated in FIGS. 10 to 13 described in Embodiment 1 so that the detailed description thereof is not repeated.

A description will be given of the function/effect of Embodiment 6.

In Embodiment 6 described above, after the mask material MK2 and the insulating film NR are removed, the mask material MK1 is dry-etched to be removed from around the trenches, while the insulating film of the mask material MK1 located over the side walls of the gate electrode layers GE is left. Then, the insulating film IIA is formed over each of the elements and in each of the trenches DTR so as to form the hollow SP in the trench DTR.

Thus, it is possible to lower the position of the upper end of the hollow SP formed in each of the trenches DTR and improve the transistor characteristic of the semiconductor device, as described above.

Note that the step is similarly applicable to Embodiments 2 to 5 other than Embodiment 6.

While the invention achieved by the present inventors has been specifically described heretofore on the basis of the embodiments thereof, the present invention is not limited to the foregoing embodiments. It will be appreciated that various changes and modifications can be made in the invention within the scope not departing from the gist thereof.

What is claimed is:

1. A method of manufacturing a semiconductor device, comprising the steps of:
    forming a plurality of gate electrodes over a main surface of a semiconductor substrate;
    forming a first insulating film over the gate electrodes such that the first insulating film is embedded in a space between the gate electrodes;
    forming a second insulating film made of a material different from that of the first insulating film over the first insulating film;
    forming a third insulating film made of a material different from that of the second insulating film over the second insulating film;
    forming a photosensitive pattern over the third insulating film;
    performing etching using the photosensitive pattern as a mask to form a trench extending through the first to third insulating films and reaching the semiconductor substrate;
    removing the photosensitive pattern so as to expose the third insulating film;
    performing etching using the exposed third insulating film as a mask to extend the trench into the semiconductor substrate;
    removing the third and second insulating films; and
    forming a fourth insulating film in the trench and over the first insulating film so as to form a hollow space in the trench,
    wherein the third insulating film is formed so as to cover a bevel portion located in a peripheral edge of the main surface of the semiconductor substrate,
    the method further comprising the step of:
    after the formation of the third insulating film, forming a fifth insulating film made of a material different from that of the third insulating film so as to cover the third insulating film over the bevel portion, wherein, with the fifth insulating film covering the third insulating film over the bevel portion, the trench is formed to extend through the first to third insulating films and reach the semiconductor substrate.

2. The method of manufacturing the semiconductor device according to claim 1, wherein the step of forming the fifth insulating film so as to cover the third insulating film over the bevel portion includes the steps of:

forming the fifth insulating film over the third insulating film; and removing the fifth insulating film until the third insulating film is exposed to leave the fifth insulating film over the bevel portion.

3. The method of manufacturing the semiconductor device according to claim 1, further comprising the step of:

after the formation of the third insulating film, planarizing the third insulating film, wherein, after the planarization of the third insulating film, the photosensitive pattern is formed over the third insulating film.

4. A method of manufacturing a semiconductor device, comprising the steps of:

forming a plurality of gate electrodes over a main surface of a semiconductor substrate;

forming a first insulating film over the gate electrodes such that the first insulating film is embedded in a space between the gate electrodes;

forming a second insulating film made of a material different from that of the first insulating film over the first insulating film;

forming a third insulating film made of a material different from that of the second insulating film over the second insulating film;

forming a photosensitive pattern over the third insulating film;

performing etching using the photosensitive pattern as a mask to form a trench extending through the first to third insulating films and reaching the semiconductor substrate;

removing the photosensitive pattern so as to expose the third insulating film;

performing etching using the exposed third insulating film as a mask to extend the trench into the semiconductor substrate;

removing the third and second insulating films and then performing anisotropic dry etching on the first insulating film to remove the first insulating film from around the trench, while leaving the first insulating film located over side walls of the gate electrodes; and forming a fourth insulating film in the trench and over the first insulating film so as to form a hollow space in the trench, wherein, after the anisotropic dry etching of the first insulating film, the fourth insulating film is formed in the trench and over the first insulating film so as to form the hollow space in the trench.

5. The method of manufacturing the semiconductor device according to claim 4, wherein the step of performing the anisotropic dry etching on the first insulating film is performed until a position of an upper end of the first insulating film remaining over the side walls of the gate electrodes is located below upper ends of the gate electrodes.

* * * * *